US012787475B2

(12) United States Patent
Honishi et al.

(10) Patent No.: US 12,787,475 B2
(45) Date of Patent: Nov. 3, 2026

(54) MANUFACTURING METHOD FOR SOLAR CELL, MULTI-JUNCTION SOLAR CELL, SOLAR CELL MODULE, AND PHOTOVOLTAIC POWER GENERATION SYSTEM

(71) Applicant: KABUSHIKI KAISHA TOSHIBA, Tokyo (JP)

(72) Inventors: Yuya Honishi, Saitama Saitama (JP); Soichiro Shibasaki, Nerima Tokyo (JP); Naoyuki Nakagawa, Setagaya Tokyo (JP); Yukitami Mizuno, Ota Tokyo (JP); Mutsuki Yamazaki, Yokohama Kanagawa (JP); Yasutaka Nishida, Tama Tokyo (JP); Atsushi Wada, Kawasaki Kanagawa (JP); Sara Yoshio, Yokohama Kanagawa (JP); Kazushige Yamamoto, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 340 days.

(21) Appl. No.: 18/581,592

(22) Filed: Feb. 20, 2024

(65) Prior Publication Data

US 2024/0194818 A1 Jun. 13, 2024

Related U.S. Application Data

(63) Continuation of application No. PCT/JP2023/011029, filed on Mar. 20, 2023.

(30) Foreign Application Priority Data

Apr. 12, 2022 (JP) ................................ 2022-065901
Mar. 16, 2023 (JP) ................................ 2023-041778

(51) Int. Cl.
*H10F 71/00* (2025.01)
*H02S 10/40* (2014.01)
(Continued)

(52) U.S. Cl.
CPC ............ *H10F 71/00* (2025.01); *H10F 19/31* (2025.01); *H10F 77/12* (2025.01); *H02S 10/40* (2014.12)

(58) Field of Classification Search
CPC .......... H10F 71/00; H10F 19/31; H10F 77/12; H02S 10/40
See application file for complete search history.

(56) References Cited

U.S. PATENT DOCUMENTS

2008/0280456 A1 11/2008 Wang et al.
2017/0025555 A1 1/2017 Zhu et al.
(Continued)

FOREIGN PATENT DOCUMENTS

CN 113728445 11/2021
JP 2005-239526 9/2005
(Continued)

OTHER PUBLICATIONS

International Search Report and Written Opinion for International Application No. PCT/JP2023/011029 mailed on Jul. 4, 2023, 8 pgs.
(Continued)

*Primary Examiner* — Marvin Payen
(74) *Attorney, Agent, or Firm* — Amin, Turocy & Watson, LLP

(57) ABSTRACT

A method for manufacturing a solar cell according to an embodiment includes forming a p-electrode on the substrate, forming a film containing cuprous oxide and/or a complex oxide of cuprous oxides as a main component on the p-electrode, and oxidizing the film containing the cuprous oxide and/or the complex oxide of cuprous oxides as a main
(Continued)

100 component. A partial pressure of oxide of the oxidizing is 5000 [Pa] or more and 200000 [Pa] or less. A concentration of vapor water of the oxidizing is $9.4\times10^{-1}$ [g/m$^3$] or more and $2.5\times10^3$ [g/m$^3$] or less. A temperature of the oxidizing is 40 [degrees Celsius] or more and 150 [degrees Celsius] or less. A duration time of the oxidizing is 10 [sec] or more and 150 [min] or less.

19 Claims, 12 Drawing Sheets

(51) Int. Cl.

| | |
|---|---|
| ***H10F 19/31*** | (2025.01) |
| ***H10F 77/12*** | (2025.01) |

(56) References Cited

U.S. PATENT DOCUMENTS

| | | | |
|---|---|---|---|
| 2020/0091357 | A1 | 3/2020 | Shibasaki et al. |
| 2021/0013360 | A1 | 1/2021 | Shibasaki et al. |
| 2021/0391491 | A1 | 12/2021 | Honishi et al. |
| 2022/0406957 | A1 | 12/2022 | Honishi et al. |
| 2024/0194817 | A1 | 6/2024 | Honishi et al. |

FOREIGN PATENT DOCUMENTS

| | | |
|---|---|---|
| JP | 2010-530129 | 9/2010 |
| JP | 2014-170865 | 9/2014 |
| JP | 2017-054917 | 3/2017 |
| JP | 2020-053669 | 4/2020 |
| JP | 2020-145426 | 9/2020 |
| JP | 6790296 | 11/2020 |
| JP | 2021-150603 | 9/2021 |
| JP | 7052114 | 4/2022 |
| JP | 2022-148125 | 10/2022 |
| JP | 2023-156234 | 10/2023 |
| WO | 2020/250521 | 12/2020 |
| WO | 2023/199704 | 10/2023 |

OTHER PUBLICATIONS

Wang, et al. "Redox Properties of Cu2O (100) and (111) Surfaces", J. Phys. Chem. C 2018, 122, 28684-28691.

Choudhary, et al. "Oxidation mechanism of thin Cu films: A gateway towards the formation of single oxide phase ", AIP Advances 8, 055114 (2018).

Chinese Office Action for Chinese Patent Application No. 202380013405.6 mailed Aug. 4, 2026.

| | Temperatrure [°C] | Partial Pressure of $O_2$ [Pa] | Duration Time [min] | Concentration of Vapor Water [$g/m^3$] | Comparison Example |
|---|---|---|---|---|---|
| Comparative Example A-1 | Not-Processed | Not-Processed | Not-Processed | Not-Processed | - |
| Example A-1 | 100 | 20000 | 10 | 10.0 | Comparative Example A-1 |
| Example A-2 | 80 | 20000 | 10 | 9.9 | Comparative Example A-1 |
| Example A-3 | 80 | 20000 | 30 | 9.9 | Comparative Example A-1 |
| Comparative Example A-2 | 300 | 20000 | 720 | 10.1 | Comparative Example A-1 |
| Example A-4 | 80 | 20000 | 60 | 9.9 | Comparative Example A-1 |
| Example A-5 | 70 | 20000 | 30 | 9.7 | Comparative Example A-1 |
| Example A-6 | 70 | 20000 | 60 | 9.7 | Comparative Example A-1 |
| Example A-7 | 60 | 20000 | 60 | 9.1 | Comparative Example A-1 |
| Example A-8 | 60 | 20000 | 90 | 9.0 | Comparative Example A-1 |
| Example A-9 | 50 | 20000 | 90 | 8.9 | Comparative Example A-1 |
| Example A-10 | 150 | 20000 | 10 | 10.4 | Comparative Example A-1 |
| Comparative Example A-3 | 200 | 20000 | 10 | 10.6 | Comparative Example A-1 |
| Example A-11 | 125 | 5000 | 30 | 1.3 | Comparative Example A-1 |
| Example A-12 | 150 | 5000 | 30 | 1.5 | Comparative Example A-1 |
| Example A-13 | 100 | 10000 | 10 | 1.4 | Comparative Example A-1 |
| Example A-14 | 100 | 20000 | 10 | 1.2 | Comparative Example A-1 |
| Example A-15 | 100 | 100000 | 10 | 1.9 | Comparative Example A-1 |

Fig. 10

| | Integral Intensity of CuO | Integral Intensity of $Cu(OH)_2$ |
|---|---|---|
| Comparative Example A-1 | D | D |
| Example A-1 | B | B |
| Example A-2 | B | B |
| Example A-3 | B | B |
| Comparative Example A-2 | A | B |
| Example A-4 | B | B |
| Example A-5 | B | B |
| Example A-6 | B | B |
| Example A-7 | B | B |
| Example A-8 | B | B |
| Example A-9 | B | B |
| Example A-10 | B | B |
| Comparative Example A-3 | A | B |
| Example A-11 | B | B |
| Example A-12 | B | B |
| Example A-13 | B | B |
| Example A-14 | B | B |
| Example A-15 | B | B |

Fig. 11

| | Temperatrure [°C] | Partial Pressure of $O_2$ [Pa] | Duration Time [min] | Concentration of Vapor Water [g/m³] | Comparison Example |
|---|---|---|---|---|---|
| Comparative Example B-1 | Not-Processed | Not-Processed | Not-Processed | Not-Processed | - |
| Example B-1 | 100 | 20000 | 10 | 10.0 | Comparative Example B-1 |
| Example B-2 | 80 | 20000 | 10 | 9.9 | Comparative Example B-1 |
| Example B-3 | 80 | 20000 | 30 | 9.9 | Comparative Example B-1 |
| Comparative Example B-2 | 300 | 20000 | 720 | 10.1 | Comparative Example B-1 |
| Example B-4 | 80 | 20000 | 60 | 9.9 | Comparative Example B-1 |
| Example B-5 | 70 | 20000 | 30 | 9.7 | Comparative Example B-1 |
| Example B-6 | 70 | 20000 | 60 | 9.7 | Comparative Example B-1 |
| Example B-7 | 60 | 20000 | 60 | 9.1 | Comparative Example B-1 |
| Example B-8 | 60 | 20000 | 90 | 9.0 | Comparative Example B-1 |
| Example B-9 | 50 | 20000 | 90 | 8.9 | Comparative Example B-1 |
| Example B-10 | 150 | 20000 | 10 | 10.4 | Comparative Example B-1 |
| Comparative Example B-3 | 200 | 20000 | 10 | 10.6 | Comparative Example B-1 |
| Example B-11 | 125 | 5000 | 30 | 1.3 | Comparative Example B-1 |
| Example B-12 | 150 | 5000 | 30 | 1.5 | Comparative Example B-1 |
| Example B-13 | 100 | 10000 | 10 | 1.4 | Comparative Example B-1 |
| Example B-14 | 100 | 20000 | 10 | 1.2 | Comparative Example B-1 |
| Example B-15 | 100 | 100000 | 10 | 1.9 | Comparative Example B-1 |

Fig. 12

| | Voc | Jsc | Conversion Efficiency |
|---|---|---|---|
| Comparative Example B-1 | — | — | — |
| Example B-1 | A | A | A |
| Example B-2 | A | A | A |
| Example B-3 | A | A | A |
| Comparative Example B-2 | B | B | B |
| Example B-4 | A | A | A |
| Example B-5 | A | A | A |
| Example B-6 | A | A | A |
| Example B-7 | A | A | A |
| Example B-8 | A | A | A |
| Example B-9 | A | A | A |
| Example B-10 | A | A | A |
| Comparative Example B-3 | A | B | B |
| Example B-11 | A | A | A |
| Example B-12 | A | A | A |
| Example B-13 | A | A | A |
| Example B-14 | A | A | A |
| Example B-15 | A | A | A |

Fig. 13

| | Crystallinity | Temperatrure [°C] | Partial Pressure of $O_2$ [Pa] | Duration Time [min] | Concentration of Vapor Water [g/m³] |
|---|---|---|---|---|---|
| Example C-1 | Polycrystalline | 150 | 20000 | 5 | 9.7 |
| Comparative Example C-1 | Single Crystal | 150 | 20000 | 5 | 9.7 |
| Comparative Example C-2 | Single Crystal | 150 | 20000 | 5 | 9.7 |
| Comparative Example C-3 | Single Crystal | 150 | 20000 | 5 | 9.7 |

Fig. 14

| | Ratio of CuO |
|---|---|
| Example C-1 | B |
| Comparative Example C-1 | A |
| Comparative Example C-2 | A |
| Comparative Example C-3 | A |

Fig. 15

| | Temperatrure [°C] | Partial Pressure of $O_2$ [Pa] | Duration Time [min] | Concentration of Vapor Water [g/m$^3$] | Comparison Example |
|---|---|---|---|---|---|
| Comparative Example D-1 | Not-Processed | Not-Processed | Not-Processed | Not-Processed | - |
| Comparative Example D-2 | 10 | 5000 | 5 | 0.94 | Comparative Example D-1 |
| Comparative Example D-3 | 10 | 10000 | 10 | 0.94 | Comparative Example D-1 |
| Comparative Example D-4 | 10 | 20000 | 5 | 0.94 | Comparative Example D-1 |
| Comparative Example D-5 | 100 | 20000 | 10 | 0.10 | Comparative Example D-1 |
| Example D-1 | 100 | 20000 | 10 | 10.1 | Comparative Example D-1 |
| Comparative Example D-6 | 100 | 20000 | 1 | 10.1 | Comparative Example D-1 |
| Comparative Example D-7 | 100 | 20000 | 10 | 50 | Comparative Example D-1 |
| Comparative Example D-8 | 70 | 1000 | 30 | 9.7 | Comparative Example D-1 |
| Example D-2 | 70 | 20000 | 30 | 9.7 | Comparative Example D-1 |
| Example D-3 | 70 | 100000 | 30 [sec] | 9.7 | Comparative Example D-1 |

Fig. 16

| | Voc | Jsc |
|---|---|---|
| Comparative Example D-1 | — | — |
| Comparative Example D-2 | B | A |
| Comparative Example D-3 | B | A |
| Comparative Example D-4 | B | A |
| Comparative Example D-5 | B | A |
| Example D-1 | A | A |
| Comparative Example D-6 | B | A |
| Comparative Example D-7 | B | B |
| Comparative Example D-8 | B | A |
| Example D-2 | A | A |
| Example D-3 | A | A |

Fig. 17

MANUFACTURING METHOD FOR SOLAR CELL, MULTI-JUNCTION SOLAR CELL, SOLAR CELL MODULE, AND PHOTOVOLTAIC POWER GENERATION SYSTEM

CROSS-REFERENCE TO RELATED APPLICATIONS

This application is a Continuation application of PCT International Patent Application No. PCT/JP2023/011029, the International filing date of which is Mar. 20, 2023, which is based upon and claims the benefit of priority from Japanese Application 2022-065901, the filling date of which is Apr. 12, 2022 and Japanese Application 2023-041778, the filling date of which is Mar. 16, 2023, the entire contents of all of which are incorporated herein by reference.

FIELD

Embodiments described herein relate generally to a manufacturing method for a solar cell, a multi-junction solar cell, a solar cell module, and a photovoltaic power generation system.

BACKGROUND

One of new solar cells is a solar cell using a cuprous oxide ($Cu_2O$) for a light-absorbing layer. $Cu_2O$ is a wide-gap semiconductor. Since $Cu_2O$ is a safe and inexpensive material including copper and oxygen abundantly present on the earth, it is expected that a high-efficiency and low-cost solar cell can be realized.

BRIEF DESCRIPTION OF THE DRAWINGS

FIG. 10 is a table related to Examples.

FIG. 11 is a table related to Examples.

FIG. 12 is a table related to Examples.

FIG. 13 is a table related to Examples.

FIG. 14 is a table related to Examples.

FIG. 15 is a table related to Examples.

FIG. 16 is a table related to Examples.

FIG. 17 is a table related to Examples.

DETAILED DESCRIPTION

A method for manufacturing a solar cell according to an embodiment includes forming a p-electrode on the substrate, forming a film containing cuprous oxide and/or a complex oxide of cuprous oxides as a main component on the p-electrode, and oxidizing the film containing the cuprous oxide and/or the complex oxide of cuprous oxides as a main component. A partial pressure of oxide of the oxidizing is 5000 [Pa] or more and 200000 [Pa] or less. A concentration of vapor water of the oxidizing is $9.4\times10^{-1}$ [g/m$^3$] or more and $2.5\times10^3$ [g/m$^3$] or less. A temperature of the oxidizing is 40 [degrees Celsius] or more and 150 [degrees Celsius] or less. A duration time of the oxidizing is 10 [sec] or more and 150 [min] or less.

Hereinafter, an embodiment will be described in detail with reference to the drawings. Unless otherwise specified, values at 25 [degrees Celsius] and 1 atm (atmosphere) are illustrated. An average represents an arithmetic mean value.

In the specification, "/" represents the division sign excluding "/" of "and/or".

First Embodiment

Figure 1:
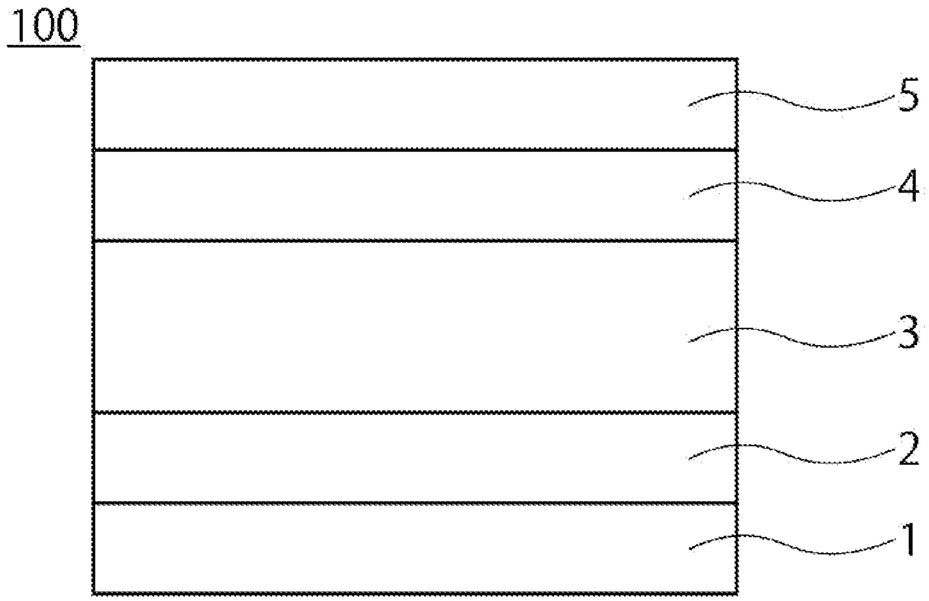
FIG. 1 is a cross-sectional diagram of a solar cell according to an embodiment.

A first embodiment relates to a solar cell and a method for manufacturing a solar cell. A cross-sectional view of the solar cell according to the first embodiment is illustrated in FIG. 1. As Illustrated in FIG. 1, the solar cell 100 according to present embodiment includes a substrate 1, a p-electrode 2 as a first electrode, a p-type light-absorbing layer 3, an n-type layer 4, and an n-electrode 5 as a second electrode. An intermediate layer which is not illustrated may be included between, for example, the n-type layer 4 and the n-electrode 5. Sunlight may be incident from either the n-electrode 5 side or the p-electrode 2 side, but is more preferably incident from the n-electrode 5 side. Since the solar cell 100 according to the embodiment is a transparent solar cell, it is preferable that the solar cell 100 is used as a top cell (light incident side) of a multi-junction solar cell. In FIG. 1, the substrate 1 is provided on a side of the p-electrode 2 opposite to the p-type light-absorbing layer 3 side. In the solar cell 100 of the embodiment, light is incident from the n-electrode 5 side toward the p-electrode 2 side. Hereinafter, although a mode illustrated in FIG. 1 will be described, a mode in which the substrate 1 is provided on the n-electrode 5 side except that a position of the substrate 1 is different is also used. In the solar cell 100 of the embodiment, light is incident from the n-electrode 5 side toward the p-electrode 2 side.

When the oxidizing process is performed, it is preferable that the substrate 1 is provided on the p-electrode 2 side.

The substrate 1 is a transparent substrate. A transparent organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide, and inorganic substrates such as soda lime glass, white glass, chemically strengthened glass, and quartz can be used as the substrate 1. As the substrate 1, the substrates listed above can be stacked.

In the embodiment, a solar cell in which a transmittance of light in a wavelength band of 700 nm or more and 1000 nm or less is 50% or more and 100% or less and cuprous oxide or/and a complex oxide of cuprous oxides is used for the p-type light-absorbing layer 3 is defined as a transparent solar cell.

It is preferable that the substrate 1 is one kind selected from the consisting of soda lime glass, white glass, chemically strengthened glass, and quartz.

The p-electrode 2 is provided on the substrate 1 and is disposed between the substrate 1 and the p-type light-absorbing layer 3. The p-electrode 2 is a conductive layer having transparency provided on the p-type light-absorbing layer 3 side. A thickness of the p-electrode 2 is typically 100 [nm] or more and 2000 [nm] or less. In FIG. 1, the p-electrode 2 is in direct contact with the light-absorbing layer 3. It is preferable that the p-electrode 2 includes one or more layers of transparent conductive oxide films. The transparent conductive oxide film is not particularly limited, and is an indium tin oxide (ITO), an Al-doped zinc oxide (AZO), a boron-doped zinc oxide (BZO), a gallium-doped zinc Oxide (GZO), a doped tin oxide, a titanium-doped indium oxide (ITiO), an indium zinc oxide (IZO), an indium gallium zinc oxide (IGZO), a hydrogen-doped indium oxide (IOH), or the like. The transparent conductive oxide film may be a stacked film having a plurality of films. A dopant for a film of tin oxide or the like is not particularly limited as long as the dopant is one or more elements selected from the group consisting of In, Si, Ge, Ti, Cu, Sb, Nb, Ta, W, Mo, F, Cl, and the like. In the doped tin oxide film, one or more elements selected from the group consisting of In, Si, Ge, Ti, Cu, Sb, Nb, Ta, W, Mo, F, Cl, and the like are preferably contained at 10 atom % or less with respect to tin contained in the tin oxide film. It is preferable that the p-electrode 2 includes a dot-shaped, line-shaped, or mesh-shaped electrode (one or more selected from the group consisting of metal, an alloy, graphene, a conductive nitride, and a conductive oxide) between the transparent conductive oxide film and the substrate 1 or between the transparent conductive oxide film and the p-type light-absorbing layer 3. It is preferable that the dot-shaped, line-shaped, or mesh-shaped metal has an aperture ratio of 50% or more with respect to the transparent conductive film. The dot-like, line-like, or mesh-like metal is not particularly limited, and is Mo, Au, Cu, Ag, Al, Ta, W, or the like. When the metal film is used for the p-electrode 2, it is preferable that a film thickness is about 10 nm or less from the viewpoint of transparency. When the line-shaped or mesh-shaped metal film is used, since the transparency is secured at an opening, the film thickness of the metal film is not limited thereto.

It is preferable that the p-electrode 2 have a stacked structure in which an indium tin oxide film and a doped tin oxide film are stacked on each other. Specifically, it is preferable that the p-electrode 2 have one or more stacked structures selected from the group including a stacked film of an indium tin oxide film and an antimony-doped tin oxide film, a stacked film of an indium tin oxide film and a fluorine-doped tin oxide film, a stacked film of an indium tin oxide film and a Ta-doped tin oxide film, and a stacked film of an indium tin oxide film and a Nb-doped tin oxide film. When the p-electrode 3 includes a doped tin oxide film, it is preferable that the doped tin oxide film be in direct contact with the light-absorbing layer 3.

It is preferable that the p-electrode 2 contains the transparent conductive oxide film containing an oxide containing one or more selected from the group consisting of In, Zn, and Sn. It is preferable that the transparent conductive oxide film is in direct contact with crystal grains of the cuprous oxide or/and the complex oxide of cuprous oxides of the p-type light-absorbing layer 3. It is preferable that 80% or more and 100% or less of a surface of the p-type light-absorbing layer 3 on the p-electrode 2 side is in direct contact with the $Cu_2O$ grains.

The p-type light-absorbing layer 3 is a p-type semiconductor layer. The p-type light-absorbing layer 3 may be in direct contact with the p-electrode 2, or other layers may be present as long as the contact with the p-electrode 2 can be secured. The p-type light-absorbing layer 3 may contain a thin n-type region (for example 1 [nm] or more and 10 [nm] or less). The conductive type of the p-type light-absorbing layer 3 excluding this n-type region is p-type including p− (p minus) type and p+ (p plus) type. The p-type light-absorbing layer 3 is disposed between the p-electrode 2 and the n-type layer 4. The p-type light-absorbing layer 3 is in direct contact with the n-type layer 4. The p-type light-absorbing layer 3 is a semiconductor layer of a metal oxide containing Cu as a main component. The metal oxide containing Cu as the main component is a cuprous oxide or/and a complex oxide of cuprous oxides. The p-type light-absorbing layer 3 is a layer of an oxide represented by $Cu_aM1_bO_c$. M1 is one or more metals selected from the group consisting of Sn, Sb, Ag, Li, Na, K, Cs, Rb, Al, In, Zn, Mg, Ca, Cl, F, Br, I, Mn, Tc, and Re. a, b, and c preferably satisfy $1.80 \le a \le 2.01$ (a is 1.80 or more and 2.01 or less), $0.00 \le b \le 0.20$ (b is 0.00 or more and 0.20 or less), and $0.98 \le c \le 1.02$ (c is 0.98 or more and 1.02 or less). 90 wt % or more of the p-type light-absorbing layer 3 is preferably the cuprous oxide or/and the complex oxide of cuprous oxides. 95 wt % or more of the p-type light-absorbing layer 3 is more preferably the cuprous oxide or/and the complex oxide of cuprous oxides. 98 wt % or more of the p-type light-absorbing layer 3 is still more preferably the cuprous oxide or/and the complex oxide of cuprous oxides. It is preferable that the p-type light-absorbing layer 3 hardly contains Cu or/and CuO which is a heterogeneous phase. When the p-type light-absorbing layer 3 contains less heterogeneous phases and has good crystallinity, the transmittance of the p-type light-absorbing layer 3 is preferably increased. When the p-type light-absorbing layer 3 contains an element of M2, the bandgap of the p-type light-absorbing layer 3 can be adjusted. The bandgap of the p-type light-absorbing layer 3 is preferably 2.0 eV or more and 2.2 eV or less. When the band gap is in such a range, sunlight can be efficiently used in both a top cell and a bottom cell in the multi-junction solar cell in which the solar cell using Si for the light-absorbing layer is used as the bottom cell and the solar cell of the embodiment is used as the top cell.

The cuprous oxide and/or the complex oxide of cuprous oxides may contain a carrier-doped cuprous oxide.

A composition ratio of the p-type light-absorbing layer 3 is a composition ratio of the entire p-type light-absorbing layer 3. It is preferable that a compound composition ratio of the p-type light-absorbing layer 3 is entirely satisfied in the p-type light-absorbing layer 3.

Figure 2:
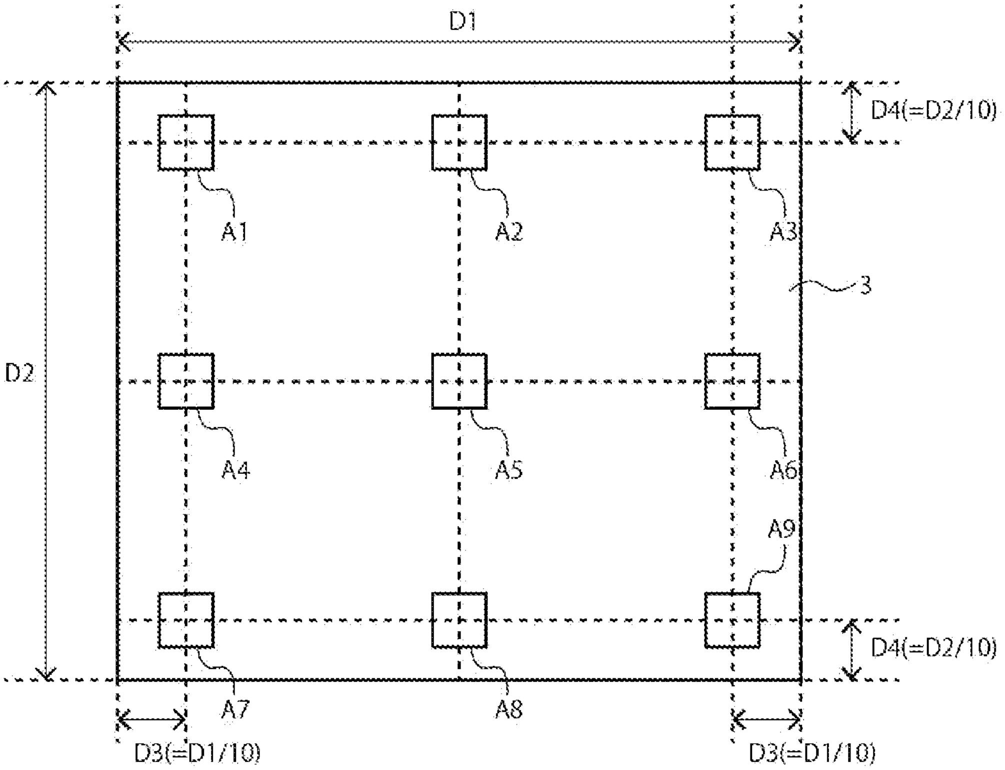
FIG. 2 is a diagram illustrating analysis spots of a solar cell according to an embodiment.

When a thickness of the p-type light-absorbing layer 3 is $d_3$, the composition of the p-type light-absorbing layer is an average value of the compositions at depths of $0.2d_3$, $0.5d_3$, and $0.8d_3$ from a surface of the p-type light absorbing layer 3 on the p-electrode 2 side. Unless there is a condition that an elemental composition ratio of the compound of the p-type light-absorbing layer 3 is inclined, the p-type light-absorbing layer 3 preferably satisfies the above compositions and the following suitable compositions at each depth. In the analysis, analysis spots (A1~A9) distributed as evenly as possible at equal intervals as represented in analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. When the p-type light absorbing layer 3 is analyzed, D1 is a length of the p-type light-absorbing layer 3 in a width direction, and D2 is a length of the light absorbing layer 3 in a depth (longitudinal) direction.

A thickness of the p-type light-absorbing layer 3 is obtained by cross-sectional observation with an electron microscope or a step profiler, and is preferably 1000 nm or more and 10000 nm or less.

The p-type light-absorbing layer 3 includes crystal grains (large particles) of the cuprous oxide or/and the complex oxide of cuprous oxide whose length in a thickness direction of the p-type light-absorbing layer 3 is 80% or more and less than 100% of the thickness of the p-type light-absorbing layer 3. An area occupying the large grains is preferably 60% or more and less than 100% of the cross-sectional area of the p-type light-absorbing layer 3 including the center of the p-type light-absorbing layer 3, and more preferably 80% or more and less than 100% of the cross-sectional area of the p-type light-absorbing layer 3 including the center of the p-type light-absorbing layer 3.

The n-type layer 4 is an n-type semiconductor layer. The n-type layer 4 is located between the p-type light-absorbing layer 3 and the n-electrode 5. The n-type layer 4 is in direct contact with a surface of the p-type light-absorbing layer 3 opposite to a surface in contact with the p-electrode 2. The n-type layer 4 is an oxide semiconductor layer containing Ga and is preferably contains an oxide having Ga as a base. The n-type layer 4 may be a mixture of the oxide having Ga as a base and other oxide, a mixture of the oxide having Ga as a base doped with one or more element, or a mixture of the oxide having Ga as a base doped with one or more element and other oxide. The n-type layer 4 is one layer or stacked layers. It is preferable that Ga ratio to metal elements in the n-type layer is 50 atom % or more. The metal elements contained in the n-type layer 4 may be inclined from the p-type-light-absorbing layer 3 to the n-electrode 5.

It is preferable that the n-type layer 4 contains an oxide containing M2 which is one or more elements selected from the group consisting of H, Sn, Sb, Cu, Ag, Li, Na, K, Cs, Rb, Al, In, Zn, Mg, Si, Ge, N, B, Ti, Hf, Zr, and Ca and Ga. It is preferable that the oxide containing M2 and Ga is contained 90 wt % or more of the n-type layer 4 is contained in the n-type layer 4. The n-type layer may contain one or more elements contained in the p-type absorbing layer 3 other than M2.

It is preferable that 90 [wt %] or more of the n-type layer 4 is the oxide containing M2 and Ga. It is preferable that 95 [wt %] or more of the n-type layer 4 is the oxide containing M2 and Ga. It is preferable that 98 [wt %] or more of the n-type layer 4 is the oxide containing M2 and Ga. It is preferable that the n-type layer 4 consists of the oxide containing M2 and Ga excluding the intermediate region described in below.

A composition of the compound of the n-type layer 4 is an average composition of the entire n-type layer 4 unless otherwise specified. When a thickness of the n-type layer 4 is $d_4$, the composition of the n-type layer 4 is an average value of the compositions at depths of $0.2d_4$, $0.5d_4$, and $0.8d_4$ from a surface (interface between the p-type light-absorbing layer 3 and the n-type layer 4) of the n-type layer 4 on the p-type light-absorbing layer 3 side. When the n-type layer 4 is very thin (for example, 5 [nm] or less), the composition at a depth of $0.5d_4$ from the surface of the n-type layer 4 on the p-type light-absorbing layer 3 side can be regarded as the composition of the entire n-type layer 4. In the analysis, analysis spots (A1~A9) distributed as evenly as possible at equal intervals as represented in analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. D1 is a length of the n-type layer 4 in a width direction, and D2 is a length of the n-type layer 4 in a depth (longitudinal) direction.

It is preferable that an intermediate region exists between the p-type light-absorbing layer 3 and the n-type layer 4. The intermediate region is a transition region from the p-type light-absorbing layer 3 and the n-type layer 4. The intermediate region contains s heterogenous phases of the cuprous oxide and/or the complex oxide of cuprous oxides of the p-type light-absorbing layer 3. The heterogenous phase contained in the intermediate region is one or more selected from the group consisting of CuO phase, Cu phase, and a phase containing Cu, Ga, M3 and O. The total amount of Cu Ga, M3, and O in the intermediate region is preferably 95 [atom %] or more and 100 [atom %] or less of all atoms contained in the intermediate region, or 98 [atom %] or more and 100 [atom %] or less of all atoms contained in the intermediate region. The CuO phase is preferably contained in the intermediate region. The element of M3 is one or more elements selected from the group consisting of Sn, Sb, Ag, Li, Na, K, Cs, Rb, Al, In, Zn, Mg, Ca, Cl, F, Br, I, Mn, Tc, Re, H, Sn, Sb, Si, Ge, N, B, Ti, Hf, and Zr.

The intermediate region is a region from a depth of 2 [nm] (start point) from the interface between the p-type light-absorbing layer 3 and the n-type layer 4 toward the n-type layer 4 to a depth of 2 [nm] (end point) from the interface between the p-type light-absorbing layer 3 and the n-type layer 4 toward the p-type light-absorbing layer 3. Since defects present in a very thin region having 4 [nm] width in the solar cell using $Cu_2O$ for the p-type light-absorbing layer 3, the conversion efficiency increases. If the region existing the heterogenous phase which is interface defects is a thick region whose width is, for example, 10 [nm], the conversion efficiency greatly decreases.

The interface between the p-type light-absorbing layer 3 and the n-type layer 4 may not be clear. When the interface between the p-type light-absorbing layer 3 and the n-type layer 4 is not clear, the center portion of unclear region is defined as the interface between the p-type light-absorbing layer 3 and the n-type layer 4. The interface between the p-type light-absorbing layer 3 and the n-type layer 4 may be uneven rather than flat. The interface between the p-type light-absorbing layer 3 and the n-type layer 4 can be determined by observing a cross section of the p-type light-absorbing layer 3 and the n-type layer 4. Since the unclear region between the p-type light-absorbing layer 3 contains the heterogenous phases, the thickness of the unclear region between the p-type light-absorbing layer 3 and the n-type layer 4 is preferably 0 [nm] or more and 10 [nm] or less, more preferably 1 [nm] or more and 5 [nm] or less, and still more preferably 2 [nm] or more and 5 [nm] or less in a stacking direction of the p-type light-absorbing layer 3 and the n-type layer 4.

The n-electrode 5 is an electrode on the n-type layer 4 side having transparency to visible light. The n-type layer 4 is sandwiched between the n-electrode 5 and the p-type light-absorbing layer 3. An intermediate layer (not illustrated) can be provided between the n-type layer 4 and the n-electrode 5. It is preferable that a transparent conductive oxide film is used for the n-electrode 5. It is preferable that the transparent conductive oxide film used for the n-electrode 5 is one or more kinds of semiconductor conductive films selected from the group consisting of an indium tin oxide, an aluminum-doped zinc oxide, a boron-doped zinc oxide, a gallium-doped zinc oxide, an indium-doped zinc oxide, a titanium-doped indium oxide, an indium gallium zinc oxide, and a hydrogen-doped indium oxide. A dopant for a film of tin oxide or the like is not particularly limited as long as the dopant is one or more elements selected from the group consisting of In, Si, Ge, Ti, Cu, Sb, Nb, Ta, W, Mo, F, Cl, and the like. Graphene can be also used for the n-electrode 5. It is preferable that the graphene is stacked with Ag nano wires.

It is preferable that the n-electrode 5 contains the transparent conductive oxide film containing an oxide containing one or more selected from the group consisting of Zn, In, and Sn. It is preferable that the transparent conductive oxide film of the n-electrode 5 is in direct contact with the n-type layer 4.

A thickness of the n-electrode 5 is obtained by cross-sectional observation with an electron microscope or a step profiler, and is not particularly limited, but is typically 50 [nm] or more and 2000 [nm] or less.

The p-type light absorbing layer 3 is preferably deposited, for example, by sputtering or the like. A surface of the p-type light-absorbing layer 3 is oxidized after forming the p-type light-absorbing layer 3. More specifically, an oxidized film containing the cuprous oxide and/or the complex oxide of cuprous oxides as a main component is the p-type light absorbing layer 3.

More specifically, an oxidized film containing the cuprous oxide and/or the complex oxide of cuprous oxides as a main component after forming the n-type layer 4 is the p-type light absorbing layer 3.

Both the film containing the cuprous oxide and/or the complex oxide of cuprous oxides and the p-type light-absorbing layer 3 which is oxidized are polycrystalline film of the cuprous oxide and/or the complex oxide of cuprous oxides.

The n-type layer 4 includes crystal grains of the cuprous oxide and/or the complex oxide of cuprous oxides whose length is 80% or more and less than 100% of a length in a thickness direction of a film containing the cuprous oxide and/or the complex oxide of cuprous oxides as a main component. An area occupying the large grains is preferably 60% or more and less than 100% of the cross-sectional area of the p-type light-absorbing layer 3 including the center of the p-type light-absorbing layer 3, and more preferably 80% or more and less than 100% of the cross-sectional area of the p-type light-absorbing layer 3 including the center of the p-type light-absorbing layer 3.

Figure 3:
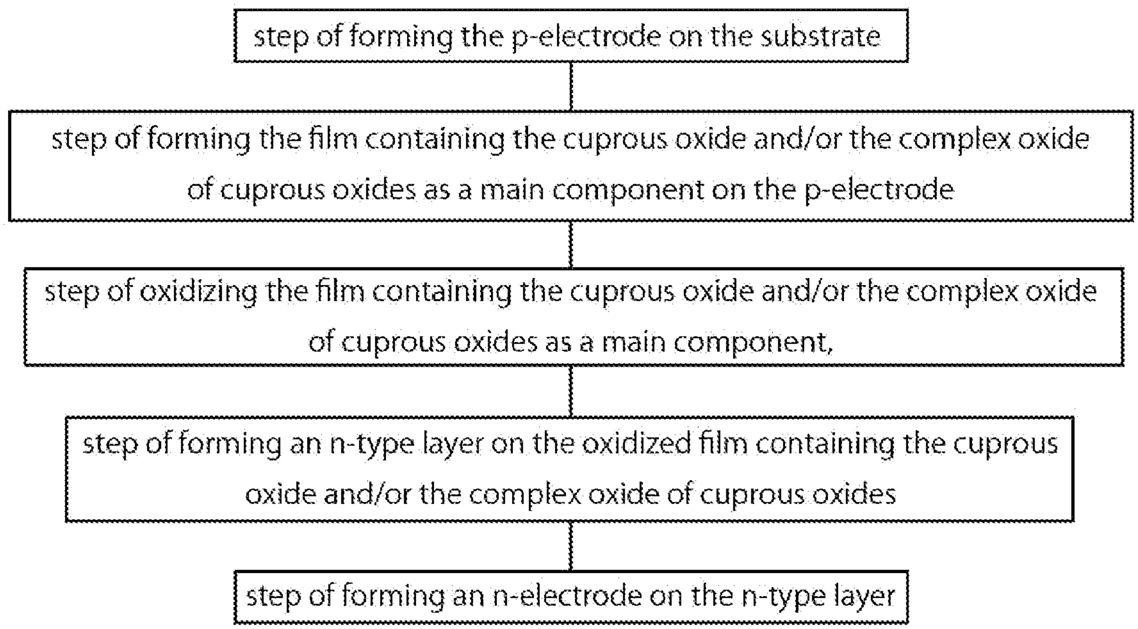
FIG. 3 is a flowchart of a manufacturing method for a solar cell according to an embodiment.

Next, a manufacturing method for the solar cell 100 will be described. A flowchart of the manufacturing method for the solar cell according to the embodiment is shown in FIG. 3. The manufacturing method for the solar cell 100 according to the embodiment includes a step of forming the p-electrode 2 on the substrate 1, a step of forming the film containing the cuprous oxide and/or the complex oxide of cuprous oxides as a main component on the p-electrode 2, a step of oxidizing the film containing the cuprous oxide and/or the complex oxide of cuprous oxides as a main component, a step of forming an n-type layer 4 on the oxidized film containing the cuprous oxide and/or the complex oxide of cuprous oxides, and a step of forming an n-electrode 5 on the n-type layer 4.

First, the p-electrode 2 is formed on the first substrate 1 as the step of forming the p-electrode on the substrate 1. The transparent conductive oxide film is deposited, for example, by sputtering. When the p-electrode 2 includes the metal film, the dot-shaped metal, the line-shaped metal, or the mesh-shaped metal, these metals are deposited and patterned as necessary.

Next, the film containing the cuprous oxide and/or the complex oxide of cuprous oxides as a main component is deposited on the p-electrode 2 as the step of forming the film containing the cuprous oxide and/or the complex oxide of cuprous oxides on the p-electrode 2. The film containing the cuprous oxide and/or the complex oxide of cuprous oxides as a main component is preferably deposited by sputtering. It is preferable to deposit the film containing the cuprous oxide and/or the complex oxide of cuprous oxides as a main component having little heterogenous phase. In the sputtering, a member in which the p-electrode 2 is formed is preferably heated at 300 [degrees Celsius] or more and 600 [degrees Celsius] or less, a deposition rate [μm/min (micrometre per minute)] is preferably 0.02 [μm/min (micrometre per minute)] or more and 20 [μm/min (micrometre per minute)] or less, and an oxygen partial pressure of the depositing atmosphere is preferably 0.01 [Pa] or more and 4.8 [Pa] or less. In view of depositing a large polycrystalline film having a high transmittance, when the deposition rate is denoted by d, the oxygen partial pressure preferably satisfies 0.55×d (0.55 times d) [Pa] or more and 1.00×d (1.00 times d) [Pa] or less. The heating temperature is more preferably 350 [degrees Celsius] or more and 500 [degrees Celsius] or less. In the depositing, the film containing the cuprous oxide and/or the complex oxide of cuprous oxides as a main component, the element of M1 can be added. When the film containing the cuprous oxide and/or the complex oxide of cuprous oxides is formed in this manner, it is preferable that a ratio of crystals (area ratio: ratio of the area of the surface of the film containing the cuprous oxide and/or the complex oxide of cuprous oxides occupied by crystals that satisfy 0.8 [$\mu m^2$ (micrometre square)]) that surface area (area bounded by grain boundaries) is more than 0.8 [$\mu m^2$ (micrometre square)] of the film containing the cuprous oxide or/and the complex oxide of cuprous oxides on a surface (a surface of the p-type light-absorbing layer 3 on the n-type layer 4 side) is 80% or more. It is preferable that a ratio of crystals that surface area is more than 1.0 [$\mu m^2$ (micrometre square)] of the film containing the cuprous oxide or/and the complex oxide of cuprous oxides on the surface side is 80% or more.

In the calculation of 0.55×d (0.55 times d) [Pa] or more and 1.00×d (1.00 times d) [Pa] or less of the oxygen partial pressure, the units (μm/min (micrometre per minute)) of deposition rate is ignored.

The oxidizing is processed to a member that the p-electrode 2 is formed on the substrate 1 and the film containing the cuprous oxide and/or the complex oxide of cuprous oxides as a main component is formed on the p-electrode 2 as the step of the oxidizing the film containing the cuprous oxide and/or the complex oxide of cuprous oxides as a main component. The oxidizing is processed in an atmosphere containing oxygen. The very thin region of the film containing the cuprous oxide and/or the complex oxide of cuprous oxides as a main component on the surface side is oxidized by the oxidizing. If the oxidizing is processed under the high temperature condition, for example, at 500 [degrees Celsius], a deep region of the film containing the cuprous oxide and/or the complex oxide of cuprous oxides as a main component is also oxidized and the excessive cupric oxide or the like is formed in the film. This cause degradation of the transmittance of film and open-circuit voltage of the solar cell. The oxidizing may include that the member that the p-electrode 2 is formed on the substrate 1 and the film containing the cuprous oxide and/or the complex oxide of cuprous oxides as a main component is formed on the p-electrode 2 is processed in an atmosphere containing oxygen in a vacuum chamber.

The member that the film containing the cuprous oxide and/or the complex oxide of cuprous oxides as a main component is oxidized, part of the cuprous oxide and/or the complex oxide of cuprous oxides of the film on the surface side is oxidized, and the part of the cuprous oxide and/or the complex oxide of cuprous oxides is changed to CuO phase and the like. The existence of these heterogenous phase can be confirmed by XRD (X-ray diffraction) or XPS (X-Ray Photoelectron Spectroscopy). In the oxidizing of the embodiment, if the oxidation progresses excessively, the product ratio of $Cu(OH)_2$ increases. Most of the CuO phase and the $Cu(OH)_2$ phase produced in the oxidizing will disappear in the solar cell 100 in which the n-type layer 4 and the others are formed. However, by virtue of the CuO phase and the $Cu(OH)_2$ phase which is produced in the very thin region of the film containing the cuprous oxide and/or the complex oxide of cuprous oxides as a main component on the surface side before forming the n-type layer 4, the solar cell 100 having high current density and high open-circuit voltage is obtained.

The CuO phase is present without the oxidizing, but the open-circuit voltage increases without degradation of the current density when the oxidizing is processed. Increasing of the open-circuit voltage is important for improving the conversion efficiency. When the oxidizing is processed in the manner of the embodiment, it was confirmed that CuO phase is formed in the very thin region of the p-type light-absorbing layer 3 on the surface side. When the p-type light-absorbing layer 3 is formed by epitaxial growth, quantitative evaluation of the CuO phase in a depth direction is easy since the surface of the p-type light-absorbing layer 3 is flat. When the p-type light-absorbing layer 3 is deposited by sputtering, the surface of the layer has fine evenness (Number-average unevenness height is 1 [nm] or more and 10 [nm] or less). When the surface of the p-type light-absorbing layer 3 has fine evenness, quantitative evaluation of the CuO phase is difficult after manufacturing the solar cell.

To avoid unintended oxidation before and after the oxidizing, it is preferable that the member that the film containing the cuprous oxide and/or the complex oxide of cuprous oxide as a main component is formed on the p-electrode 2 is stored. After oxidizing the film containing the cuprous oxide and/or the complex oxide of cuprous oxide as a main component, it is preferable that the member after oxidizing is stored in an atmosphere with an oxygen partial pressure of 50 [Pa] or less and a temperature of 80 [degrees Celsius] or less or more preferably 50 [degrees Celsius] or less, or the n-type layer 4 is deposited continuously. The oxidized member is stored in air with a temperature of, for example, 30 [degrees Celsius] or less for 1 hour or less or preferably 30 minutes or less until depositing the n-type layer 4. Before the oxidizing the member is stored preferably in an atmosphere with an oxygen partial pressure of 50 [Pa] or less and a temperature of 80 [degrees Celsius] or less and more preferably 50 [degrees Celsius] or less or in air with a temperature of 30 [degrees Celsius] or less for 1 hour or less and preferably 30 minutes or less. In these of atmosphere, ozone may be contained 0.1% or less of the oxygen partial pressure.

A concentration (weight/volume) of vapor water of the storing atmosphere is preferably $5.0\times10^{-8}$ [g/L] or more and $5.0\times10^{-5}$ [g/L] or less and more preferably $5.0\times10^{-8}$ [g/L] or more and $4.0\times10^{-5}$ [g/L] or less.

It is preferable that plasma gas is not contained in the storing atmosphere.

Regarding the oxidizing, the member that the film containing the cuprous oxide and/or the complex oxide of cuprous oxide as a main component is formed on the p-electrode 2 is placed on a stage of a chamber, and a total pressure of the chamber can be reduced to $2\times10^{-4}$ [Pa] or more and $1\times10^{-1}$ [Pa] or less before introducing a gas containing oxygen. A gas for oxidizing is introduced after the total pressure in the chamber is stabilized. The member that the film containing the cuprous oxide and/or the complex oxide of cuprous oxide as a main component is heated at a temperature described in below before introducing oxygen (oxidizing gas).

The oxidizing atmosphere (gas) contains oxygen. In the oxidizing atmosphere, ozone may be contained 0.0% or more and 0.1% or less (a maximum ozone pressure is 1 [Pa])) of the oxygen partial pressure. In the oxidizing atmosphere, inevitable materials (molecule) contained in air, for example, carbon mono-oxide, carbon dioxide, hydrocarbons, hydrogen, and the like may be contained. The oxidizing atmosphere may contain 5000 ppm or less of the inevitable materials (molecule) contained in air, for example, carbon mono-oxide, carbon dioxide, hydrocarbons, hydrogen, and the like may be contained. Inert gas, for example, nitrogen, Ar and the like and hydrogen may be also contained in the oxidizing atmosphere. Other reactive gas other than oxygen and ozone is not introduced to the chamber for oxidizing since the oxidizing atmosphere does not contain other reactive gas other than oxygen and ozone. Therefore, it is preferable that oxygen gas and optionally ozone and/or inert gas are only introduced to the chamber. The sum of the partial pressure of oxygen and the partial pressure of inert gas (=([partial pressure of oxygen]+[partial pressure of inert gas])/[total pressure excluding the vapor water of the oxidizing atmosphere]) is preferably 99.0% or more and 100% or less and more preferably 99.3% or more and 100% or less (99.3% or more and 99.9% or less) of the total pressure excluding the vapor water of the oxidizing atmosphere.

The partial pressure [Pa] of oxygen of the oxidizing is preferably 5% or more and 100% or less and more preferably 10% or more and 100% or less of the total pressure [Pa] of the oxidizing atmosphere.

It is preferable that the partial pressure of oxygen of the oxidizing is 5000 [Pa] or more and 200000 [Pa] or less. When the partial pressure of oxygen is too low, the productivity is poor since the processing time becomes long or the oxidizing reaction does not process. When the partial pressure of oxygen is too high, the oxidizing reaction processed from the surface of the cuprous oxide and/or the complex oxide of cuprous oxides until a deep region. Therefore, the partial pressure of oxygen of the oxidizing is preferably 8000 [Pa] or more and 30000 [Pa] or less and more preferably 10000 [Pa] or more and 25000 [Pa] or less. The partial pressure of oxygen and the partial pressure of ozone is a value in the chamber.

The temperature of the oxidizing is preferably 40 [degrees Celsius] or more and 150 [degrees Celsius] or less. When the temperature of the oxidizing is too low, the productivity is poor since the processing time becomes long or the oxidizing reaction does not process. When the temperature of the oxidizing is too high, the oxidizing reaction processed from the surface of the cuprous oxide and/or the complex oxide of cuprous oxides until a deep region. Therefore, the temperature of the oxidizing is preferably 45 [degrees Celsius] or more and 120 [degrees Celsius] or less, more preferably 50

[degrees Celsius] or more and 120 [degrees Celsius] or less, and still more preferably 50 [degrees Celsius] or more and 90 [degrees Celsius] or less. The temperature of the oxidizing is a temperature of the surface of the cuprous oxide and/or the complex oxide of cuprous oxide. The oxidizing reaction is low exothermic since the oxidizing reaction is mild. Therefore, the temperature of the surface of the cuprous oxide and/or the complex oxide of cuprous oxide of the member that the film containing the cuprous oxide and/or the complex oxide of cuprous oxide as a main component is formed on the p-electrode 2 is substantially the same as the temperature of the member that the film containing the cuprous oxide and/or the complex oxide of cuprous oxide as a main component is formed on the p-electrode 2. The temperature of the member that the film containing the cuprous oxide and/or the complex oxide of cuprous oxide as a main component is formed on the p-electrode 2 is a set temperature of the stage of the chamber used for the oxidizing. The set temperature is the oxidizing temperature.

The duration time of the oxidizing is preferably 10 [sec] or more and 150 [min] or less. When the duration time of the oxidizing is too short, the productivity is poor since the processing time becomes long or the oxidizing reaction does not process. When the duration time of the oxidizing is too long, the oxidizing reaction processed from the surface of the cuprous oxide and/or the complex oxide of cuprous oxides until a deep region. Therefore, the duration time of the oxidizing is preferably 5 [min] or more and 120 [min] or less and more preferably 10 [min] or more and 90 [min] or less.

The concentration of vapor water of the oxidizing atmosphere is preferably $9.4\times10^{-1}$ [g/m$^3$] or more and $2.5\times10^{3}$ [g/m$^3$] or less. When the concentration of vapor water of the oxidizing atmosphere is too low, it is not preferable that $Cu(OH)_2$ is hardly produced. When the concentration of vapor water of the oxidizing atmosphere is too high, the oxidizing reaction proceeds excessively. Therefore, the concentration of vapor water of the oxidizing atmosphere is preferably 1.0 [g/m$^3$] or more and $5.9\times10^{2}$ [g/m$^3$] or less and more preferably 2.3 [g/m$^3$] or more and $8.2\times10^{1}$ [g/m$^3$] or less.

Regarding the oxidizing process, when the partial pressure of oxygen is 5000 [Pa] or more and 50000 [Pa] or less, the temperature of the oxidizing is preferably 50 [degrees Celsius] or more and 150 [degrees Celsius] or less. When the partial pressure of oxygen is 5000 [Pa] or more and 50000 [Pa] or less and the temperature of the oxidizing is 50 [degrees Celsius] or more and 150 [degrees Celsius] or less, the duration time of the oxidizing is preferably 5 [min] or more and 150 [min] or less and more preferably 5 [min] or more and 60 [min] or less. When the partial pressure of the oxidizing is medium to high, the very thin region of the cuprous oxide and/or the complex oxide of cuprous oxide on the surface side is locally oxidized at medium temperature to high temperature for medium duration time to long duration time.

Regarding the oxidizing process, when the partial pressure of oxygen is 10000 [Pa] or more and 200000 [Pa] or less, the temperature of the oxidizing is preferably 40 [degrees Celsius] or more and 120 [degrees Celsius] or less. When the partial pressure of oxygen is 10000 [Pa] or more and 200000 [Pa] or less and the temperature of the oxidizing is 40 [degrees Celsius] or more and 120 [degrees Celsius] or less, the duration time of the oxidizing is preferably 10 [sec] or more and 120 [min] or less and more preferably 10 [sec] or more and 60 [min] or less. When the partial pressure of the oxidizing is medium to high, the very thin region of the cuprous oxide and/or the complex oxide of cuprous oxide on the surface side is locally oxidized at the low temperature to the high temperature for the short duration time to the long duration time.

Regarding the oxidizing process, when the temperature of the oxidizing is 75 [degrees Celsius] or more and 125 [degrees Celsius] or less, it is preferable that the partial pressure of oxygen is preferably 5000 [Pa] or more and 200000 [Pa] or less and the duration time of oxygen is 5 [min] or more and 45 [min] or less. Regarding the oxidizing process, when the temperature of the oxidizing is 75 [degrees Celsius] or more and 125 [degrees Celsius] or less, it is more preferable that the partial pressure of oxygen is preferably 5000 [Pa] or more and 100000 [Pa] or less and the duration time of oxygen is 10 [min] or more and 60 [min] or less. When the oxidizing is processed under these conditions, the very thin region is stably oxidized. When one or more conditions does not satisfy above conditions, the balance among temperature, the partial pressure of oxygen, and the duration time is important. When the temperature of the oxidizing is high, the conditions are adjusted by decreasing the partial pressure of oxygen or by decreasing the duration time not to proceed oxidation into the deep region. Comparing above conditions with below conditions, it seems that the oxidizing proceeds excessively at 75 [degrees Celsius] or more and 125 [degrees Celsius] or less, but, actually, the very thin region of the film on the surface side is locally oxidized. When the temperature of the oxidizing is 75 [degrees Celsius] or more and 125 [degrees Celsius] or less, the oxidizing is difficult to proceed into the deep region with the partial pressure of oxygen within 5000 [Pa] or more and 200000 [Pa] or less for the duration time within 5 [min] to 60 [min]. The temperature of the oxidizing is more preferably 80 [degrees Celsius] or more and 120 [degrees Celsius] or less. When the temperature of the oxidizing is 80 [degrees Celsius] or more and 120 [degrees Celsius] or less, the partial pressure of oxygen is preferably 5000 [Pa] or more and 200000 [Pa] or less and the duration time is preferably 5 [min] or more and 60 [min] or less. When the temperature of the oxidizing is 80 [degrees Celsius] or more and 120 [degrees Celsius] or less, the partial pressure of oxygen is preferably 5000 [Pa] or more and 100000 [Pa] or less and the duration time is preferably 10 [min] or more and 45 [min] or less.

When the concentration of the vapor water is high and the partial pressure of oxygen is too high, the oxidizing may proceed excessively. Regarding the oxidizing, when the temperature of the oxidizing is 40 [degrees Celsius] or more and 80 [degrees Celsius] or less, the partial pressure of oxygen is 5000 [Pa] or more and 200000 [Pa] or less, and the duration time of the oxidizing is 5 [min] or more and 45 [min] or less, it is preferable that the concentration of vapor water is $9.4\times10^{-1}$ [g/m$^3$] or more and $2.5\times10^{1}$ [g/m$^3$] or less.

Regarding the oxidizing process, when the duration time is 10 [sec] or more and less than 5 [min] and the temperature of the oxidizing is 40 [degrees Celsius] or more and less than 110 [degrees Celsius], the partial pressure of oxygen is preferably 30000 [Pa] or more and 200000 [Pa] or less and more preferably 50000 [Pa] or more and 100000 [Pa] or less. When the temperature of the oxidizing is low to medium and the duration time is very short, the very thin region of the cuprous oxide and/or the complex oxide of cuprous oxide on the surface side is locally oxidized at the high partial pressure of oxygen.

Regarding the oxidizing process, when the duration time is 10 [sec] or more and less than 5 [min] and the temperature of the oxidizing is 110 [degrees Celsius] or more and 150 [degrees Celsius] or less, the partial pressure of oxygen is preferably 10000 [Pa] or more and 100000 [Pa] or less and more preferably 15000 [Pa] or more and 50000 [Pa] or less. When the temperature of the oxidizing is high and the duration time is very short, the very thin region of the cuprous oxide and/or the complex oxide of cuprous oxide on the surface side is locally oxidized at the medium partial pressure of oxygen.

Regarding the oxidizing process, when the duration time is 5 [min] or more and less than 10 [min] and the temperature of the oxidizing is 40 [degrees Celsius] or more and less than 110 [degrees Celsius], the partial pressure of oxygen is preferably 10000 [Pa] or more and 100000 [Pa] or less and more preferably 15000 [Pa] or more and 100000 [Pa] or less. When the temperature of the oxidizing is low to medium and the duration time is short, the very thin region of the cuprous oxide and/or the complex oxide of cuprous oxide on the surface side is locally oxidized at the medium partial pressure of oxygen.

Regarding the oxidizing process, when the duration time is 10 [min] or more and less than 60 [min] and the temperature of the oxidizing is 40 [degrees Celsius] or more and less than 80 [degrees Celsius], the partial pressure of oxygen is preferably 10000 [Pa] or more and 50000 [Pa] or less and more preferably 15000 [Pa] or more and 40000 [Pa] or less. When the temperature of the oxidizing is low to medium and the duration time is medium to somewhat long, the very thin region of the cuprous oxide and/or the complex oxide of cuprous oxide on the surface side is locally oxidized at the medium partial pressure of oxygen.

Regarding the oxidizing process, when the duration time is 60 [min] or more and less than 90 [min] and the temperature of the oxidizing is 40 [degrees Celsius] or more and less than 120 [degrees Celsius], the partial pressure of oxygen is preferably 10000 [Pa] or more and 40000 [Pa] or less and more preferably 15000 [Pa] or more and 35000 [Pa] or less. When the temperature of the oxidizing is low to high and the duration time is somewhat long, the very thin region of the cuprous oxide and/or the complex oxide of cuprous oxide on the surface side is locally oxidized at the medium partial pressure of oxygen.

Regarding the oxidizing process, when the duration time is 90 [min] or more and 150 [min] or less and the temperature of the oxidizing is 40 [degrees Celsius] or more and less than 60 [degrees Celsius], the partial pressure of oxygen is preferably 5000 [Pa] or more and 25000 [Pa] or less and more preferably 5000 [Pa] or more and 21000 [Pa] or less. When the temperature of the oxidizing is low and the duration time is long, the very thin region of the cuprous oxide and/or the complex oxide of cuprous oxide on the surface side is locally oxidized at the low partial pressure of oxygen.

When the partial pressure of oxygen is high, the oxidizing process is easily controlled by decreasing the temperature of the oxidizing and decreasing the duration time of the oxidizing. When the temperature of the oxidizing is high, the oxidizing process is easily controlled by decreasing the partial pressure of oxygen and decreasing the duration time of the oxidizing.

When the partial pressure of oxygen is low, the oxidizing process is easily controlled by increasing the temperature of the oxidizing and increasing the duration time of the oxidizing. When the temperature of the oxidizing is low, the oxidizing process is easily controlled by increasing the partial pressure of oxygen and increasing the duration time of the oxidizing.

It is preferable that the gas used for the oxidizing is continuously replaced in the oxidizing. When a volume of the chamber used for the oxidizing is L1 [L], it is preferable that the amount of the gas flowing to the chamber is 1/20 [L/min] or more and 100×L1 [L/min] or less.

The partial pressure of oxygen in gas (the oxidizing atmosphere) may be determined from a concentration of oxygen in the gas by using, for instance, a galvanic cell type oxygen sensor or a zirconia oxide sensor. In addition, the concentration of vapor water in gas may be determined from a dew point and a temperature as measured using, for instance, a dew point meter of capacitance type or specular reflection type.

Regarding the oxidizing of the embodiment, the oxidizing process is easily affected by the partial pressure of oxygen, the temperature of the oxidizing, and the duration time of the oxidizing. Then the partial pressure of oxygen is high, the temperature of the oxidizing is high, and the duration time of the oxidizing is long, the oxidizing is promoted. The very thin region of the cuprous oxide and/or the complex oxide of cuprous oxide on the surface side can be locally oxidized by oxidizing so that the three conditions are met. When the three conditions are not met, the oxidizing is excessively processed or the oxidizing reaction hardly occurs.

It is preferable that the oxidizing is processed to the film of the cuprous oxide and/or the complex oxide of cuprous oxides which is formed by sputtering. The film of the cuprous oxide and/or the complex oxide of cuprous oxides which is formed by sputtering has a surface which have fine evenness. By virtue of the oxidizing the film of the cuprous oxide and/or the complex oxide of cuprous oxides formed by sputtering whose surface have fine evenness, preferable oxidizing is performed. It may contribute to improving the open circuit voltage of the solar cell.

The partial pressure of oxygen is a partial pressure of $O_2$ gas in the processing atmosphere. During the oxidizing, any $O_2$ gas plasmaization is not performed.

By virtue of applying the oxidation to the polycrystalline film, the very thin region (for example, a region from the surface of the film containing the cuprous oxide and/or the complex oxide of cuprous oxides to a depth of one atomic layer or 1 [nm]) of the surface of the cuprous oxide and/or the complex oxide of cuprous oxides is only oxidized. If the conditions of the oxidizing is different (for example, oxidizing of small particles of $Cu_2O$, oxidizing of single crystal of $Cu_2O$, following may occur that very low concentration of oxygen), $Cu_2O$ is not oxidized, the surface of the film containing the cuprous oxide and/or the complex oxide of cuprous oxides is partially oxidized, the oxidation is proceeded to the deep region, or the grain size of $Cu_2O$ is increased by recrystallization.

The crystallinity or presence or absence of the heterogenous phase is changed depends on the forming condition of the film containing the cuprous oxide and/or the complex oxide of cuprous oxides. Therefore, it is considered that a reaction mechanism of the oxidizing of the film containing the cuprous oxide and/or the complex oxide of cuprous oxide is different from a reaction mechanism of the oxidizing of the single crystal $Cu_2O$ since there are no reports of CuO forming in a thin region of the single crystal $Cu_2O$ film on a surface side by annealing.

When a $Cu_2O$ film whose surface has many OH groups ($Cu(OH)_2$) is oxidized, the oxidizing is proceeded to a deep region of the $Cu_2O$ film since the OH groups promote the oxidizing. When the thin region of the film containing the cuprous oxide and/or the complex oxide of cuprous oxides as a main component on the surface side, it is preferable that a process which increases amount of the OH group is not performed after forming the film containing the cuprous oxide and/or the complex oxide of cuprous oxides as a main component.

When the oxidizing according to the embodiment is processed, the oxidizing is not proceeded to the deep region. A CuO phase ratio to the total phases of a region from the surface of the film containing the cuprous oxide and/or the complex oxide of cuprous oxides in which the oxidizing is processed to a depth of 10 [nm] is preferably 0.1% or more and 10% or less and 1% or more and 10% or less.

The oxidizing is processed under the conditions of the oxidizing for the film containing the cuprous oxide and the complex oxide of cuprous oxides, it is predicted that decreasing the conversion efficiency and transparency due to increasing defects. Considering the conversion efficiency and the transparency, such oxidizing after forming the film containing the cuprous oxide and/or the complex oxide of cuprous oxides whose crystallinity is good is generally avoided. When an oxidation is not sufficient, an oxidation for a film is required. However, the conversion efficiency can be improved by controlling the oxidizing condition for the film containing the cuprous oxide and/or the complex oxide of cuprous oxides whose crystallinity is good.

When the oxidizing according to the embodiment is processed to the single crystal $Cu_2O$ film, a deep region of the single crystal film is easy to be oxidized.

The oxidizing is effective for the film containing the cuprous oxide and/or the complex oxide of cuprous oxides deposited by sputtering which enables the transparent solar cell.

A p-dopant or/and an n-dopant can be doped with the p-type light-absorbing layer 3 before or/and after the oxidizing.

The n-type layer is deposited by, for example, ALD (Atomic Layer Deposition), CVD (Chemical Vapor Deposition) or the like on the film containing the cuprous oxide and the complex oxide of cuprous oxides after processing the oxidizing as a step of forming the n-type layer on the oxidized film containing the cuprous oxide and/or the complex oxide of cuprous oxides.

The n-electrode 5 is deposited on the n-type layer 4 by sputtering or the like as a step of forming the n-electrode 5 on the n-type layer 4. When an intermediate layer is provided between the n-type layer 4 and the n-electrode 5, the intermediate layer is formed before forming the n-electrode 5. The solar cell 100 includes the substrate 1, the p-electrode 2, a p-type light-absorbing layer 3 contains the cuprous oxide and/or the complex oxide of cuprous oxides whose surface is oxidized, the n-type layer 4, and the n-electrode 5 by the above processes.

The conversion efficiency of the solar cell that the n-type layer 4 is formed on the oxidized surface of the film containing the cuprous oxide and/or the complex oxide of cuprous oxides and the n-electrode 5 is formed on the n-type layer 4 is improved by the oxidizing.

Second Embodiment

Figure 4:
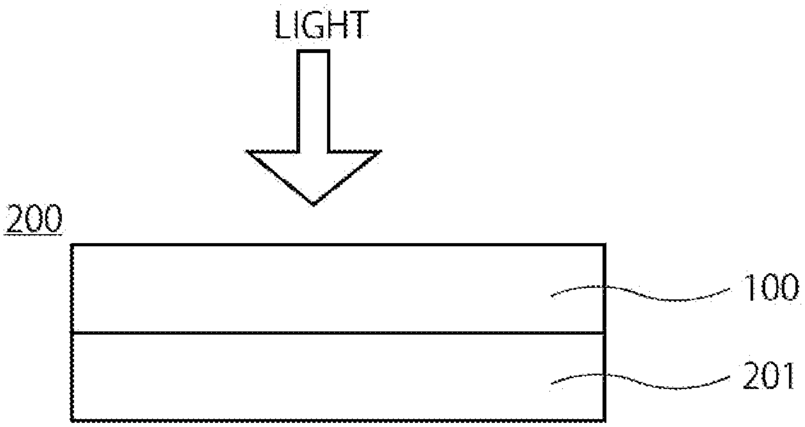
FIG. 4 is a cross-sectional diagram of a multi-junction solar cell according to an embodiment.

A second embodiment relates to a multi-junction solar cell. FIG. 4 illustrates a cross-sectional diagram of a multi-junction solar cell according to the second embodiment. The multi-junction solar cell 200 of FIG. 4 includes the solar cell (first solar cell) 100 according to the first embodiment on the light incident side and a second solar cell 201. The band gap of the p-type light-absorbing layer of the second solar cell 201 is smaller than the band gap of the light-absorbing layer 3 of the solar cell 100 according to the first embodiment. Incidentally, the multi-junction solar cell according to the embodiment includes a solar cell in which three or more solar cells are bonded.

The band gap of the p-type light-absorbing layer 3 of the first solar cell 100 according to the first embodiment is about 2.0 eV-2.2 eV, and thus the band gap of the light-absorbing layer of the second solar cell 201 is preferably 1.0 eV or more and 1.6 eV or less. The light-absorbing layer of the second solar cell 201 is preferably selected from the group consisting of any one or more compound semiconductor layers among CIGS-based having a high In content and CdTe-based compound semiconductor layers, crystalline silicon and perovskite type compound.

Third Embodiment

Figure 5:
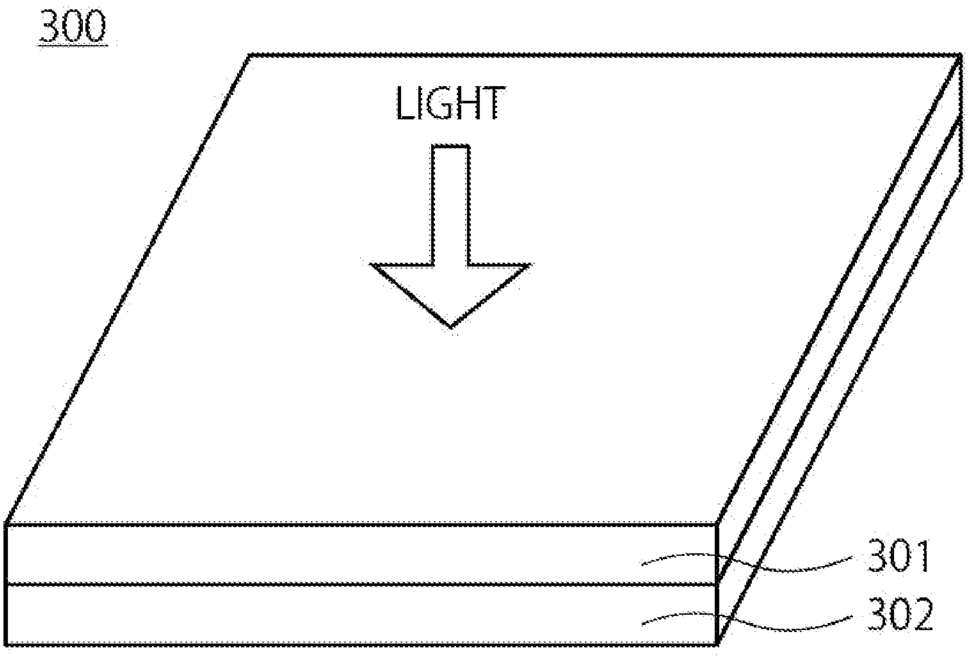
FIG. 5 is a perspective diagram of a solar cell module according to an embodiment.

A third embodiment relates to a solar cell module. FIG. 5 illustrates a perspective diagram of a solar cell module 300 according to the third embodiment. The solar cell module 300 in FIG. 5 is a solar cell module in which a first solar cell module 301 and a second solar cell module 302 are stacked one on the other. The first solar cell module 301 is on the light incident side and includes the solar cell 100 according to the first embodiment. It is preferable to use the second solar cell 201 in the second solar cell module 302.

Figure 6:
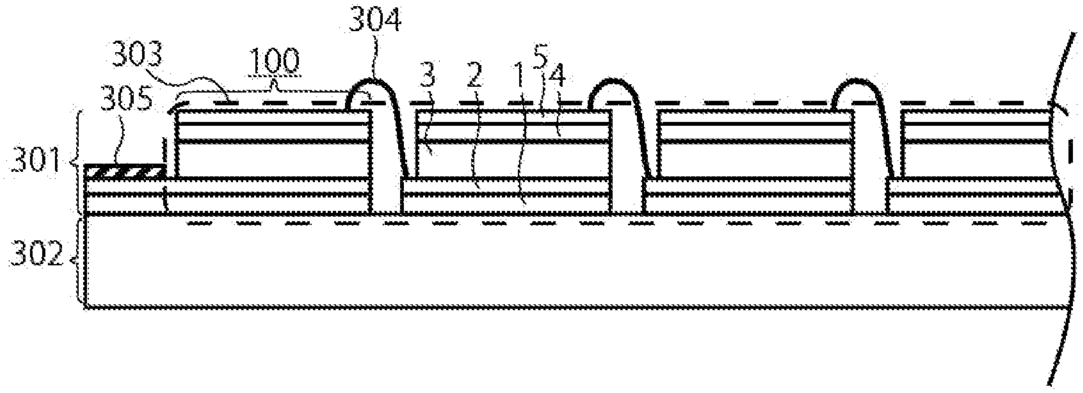
FIG. 6 is a cross-sectional diagram of a solar cell module according to an embodiment.

FIG. 6 illustrates a sectional diagram of the solar cell module 300. In FIG. 6, the structure of the first solar cell module 301 is illustrated in detail but the structure of the second solar cell module 302 is not illustrated. In the second solar cell module 302, the structure of the solar cell module is appropriately selected depending on the light-absorbing layer of the solar cell to be used. In the solar cell module 300 in FIG. 6, a plurality of submodules 303 in which a plurality of solar cells 100 are arranged in the horizontal direction and electrically connected to each other by a wiring 304 in series and which is enclosed by a broken line are included and the plurality of submodules 303 are electrically connected to each other in parallel or in series. Adjacent submodules are electrically connected by a busbar 305.

In adjacent solar cells 100, the n-electrode 5 on the upper side and the p-electrode 2 on the lower side are connected by the wiring 304. Both ends of the solar cell 100 in the submodule 303 are connected to the busbar 305, the busbar 305 is preferably configured to electrically connect a plurality of submodules 303 in parallel or in series and adjust the output voltage with the second solar cell module 302. Incidentally, the connection system of the solar cell 100 shown in the third embodiment is an example, the solar cell module can be configured by other connection systems.

Fourth Embodiment

Figure 7:
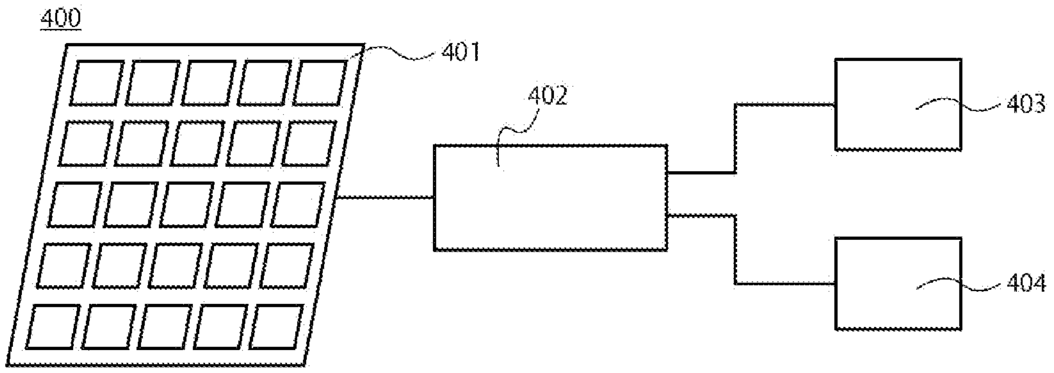
FIG. 7 is a structural view of a photovoltaic power generation system according to an embodiment.

A fourth embodiment relates to a solar photovoltaic power generation system. The solar cell module 300 according to the third embodiment can be used as a generator which generates electric power in the solar photovoltaic power generation system according to the fourth embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 7 illustrates a configuration diagram of a solar photovoltaic power generation system 400 according to the embodiment. The solar photovoltaic power generation system in FIG. 7 includes a solar cell module 401 (300), a converter 402, a storage battery 403, and a load 404. Either of the storage battery 403 or the load 404 may be omitted. The load 404 may be configured to be able to utilize the electric energy stored in the storage battery 403. The converter 402 is an apparatus including a circuit or a device which performs power conversion such as voltage transformation or DC-AC conversion such as a DC-DC converter, DC-AC-converter, AC-AC-converter and the like. As the configuration of the converter 402, a suitable configuration may be adopted depending on the configuration of the generated voltage, the storage battery 403, and the load 404.

The solar cells included in the submodule 300 generate electric power, the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the solar cell having an excellent conversion efficiency according to the embodiment is used in the solar cell module 401.

Figure 8:
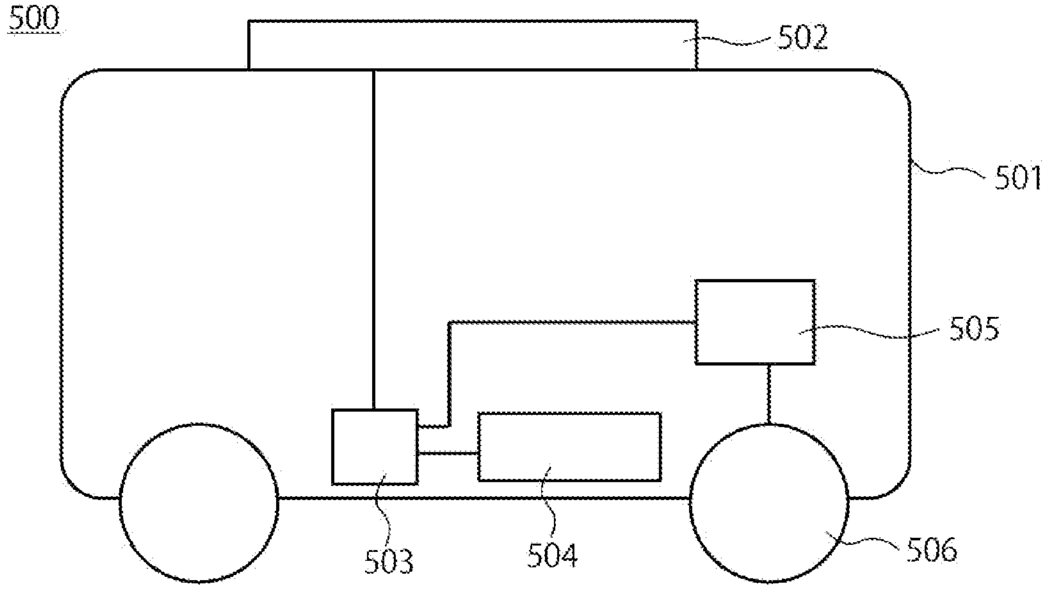
FIG. 8 is a conceptual diagram of a vehicle according to an embodiment.

A vehicle is described as an example of utilization of the solar photovoltaic power generation system 400. FIG. 8 illustrates a conceptual configuration diagram of a vehicle 500. The vehicle 500 in FIG. 8 includes a vehicle body 501, a solar cell module 502, a power converter 503, a storage battery 504, a motor 505, and tires (wheels) 506. The electric power generated by the solar cell module 502 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 502 or the storage battery 504. The solar cell module 502 may not be a multi-junction type but may be configured only of such as the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501.

Figure 9:
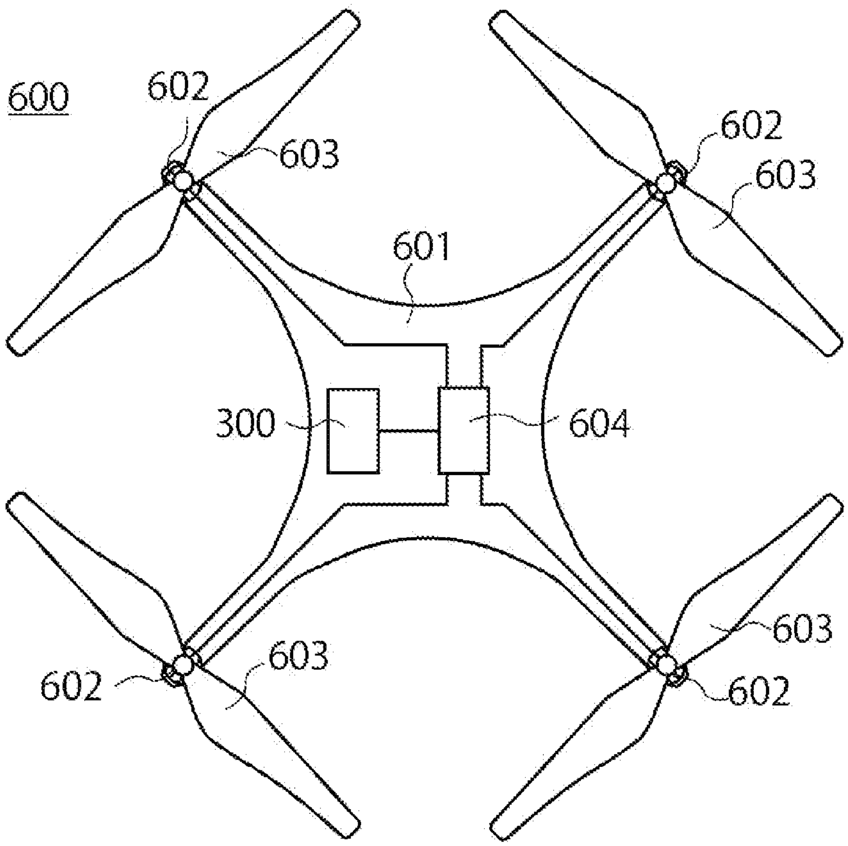
FIG. 9 is conceptual diagram of a flying object according to an embodiment.

A flying object (multi-copter) is described as an example of utilization of the solar photovoltaic power generation system 400. The flying object uses a solar cell module 300. A configuration of the flying object according to the present embodiment will be briefly described using a schematic view of a flying object 600 (quadcopter) of FIG. 9. The flying object 600 includes a solar cell module 300, a body frame 601, motors 602, rotary wings 603, and a control unit 604. The solar cell module 300, the motors 602, the rotary wings 603, and the control unit 604 are disposed in the body frame 601. The control unit 604 converts power output from the solar cell module 300 and adjusts output. The control unit 604 can further include a storage battery that stores the generated power by the solar cell module 300. The motors 602 rotate the rotary wings 603 using the power output from the solar cell module 300. By using the flying object 600 with the present configuration having the solar cell module 300 according to the embodiment, a flying object that can fly using more electric power is provided.

Hereinafter, the present disclosure will be described more specifically based on Examples, but the present disclosure is not limited to the following Examples.

Example A-1~A-15, Comparative Example A-1~A-3

ITO (In:Sn=80:20, film thickness 20 nm) on a side in contact with glass and ATO (Sn:Sb=98:2, film thickness: 150 nm) are deposited on an upper surface of a glass substrate as a p-electrode on a back surface side. A $Cu_2O$ light-absorbing layer is formed on a transparent p-electrode by heating at 500 [degrees Celsius] by a sputtering method in an oxygen and argon gas atmosphere. Next the surface of the $Cu_2O$ light-absorbing layer is oxidized in conditions shown in FIG. 10. Then, the surface of the $Cu_2O$ light-absorbing layer which is oxidized is observed by XPS. Peak heights corresponding to $Cu_2O$, CuO, and $Cu(OH)_2$ are determined. The integral intensities determined from XPS are shown in FIG. 11.

In the XPS analysis, Quantera SXM (ULVAC-PHI Inc) is used, Al Kα (single crystal spectroscopy) is used as a X-ray source, a x-ray output is 50 W, a x-ray radiation area is 200 μmΦ~300 μmφ, a x-ray radiation angle to the sample is 45 [degree], and an angle between the sample and detector is 90 [degree]. XPS analysis is conducted without an electrification neutralization gun. The measurement is performed under the conditions, the ratio of $Cu_2O$ and its heterogenous phases. the ratio of CuO and the ratio of $Cu(OH)_2$ contained in the very thin region of the cuprous oxide and the complex oxide of cuprous oxides on the surface side can be evaluated.

Regarding the ratios of $Cu_2O$, CuO, and $Cu(OH)_2$, a spectrum of Cu 2p 3/2 (binding energy: around 932.5 eV) obtained by XPS analysis is fitted with a pseudo-forked function at $Cu_2O$ (Center: around 932.5 eV), CuO (Center: around 933.7 eV), and $Cu(OH)_2$ (Center: around 935.1 eV), respectively, and the XPS spectrum is fitted in the ratio of 40% of Lorentz distribution formula and 60% of Gaussian distribution formula. Furthermore, the base line of the XPS spectrum is determined by active Shirley method. The integral area bounded by the fitted pseudo-forked function and the baseline is defined as the integral intensity. The integral intensities of $Cu_2O$, CuO, and $Cu(OH)_2$ are calculated, respectively. The ratio of $Cu_2O$ is represented with $Cu_2O$ [%] (=[integral intensity of $Cu_2O$]/[([integral intensity of $Cu_2O$]+[integral intensity of CuO]+[integral intensity of $Cu(OH)_2$])×100). The ratio of CuO is represented with CuO [%] (=[integral intensity of CuO]/([integral intensity of $Cu_2O$]+[integral intensity of CuO]+[integral intensity of $Cu(OH)_2$])×100. The ratio of $Cu_2O$ is represented with $Cu(OH)_2$ [%] (=[integral intensity of $Cu(OH)_2$]/([integral intensity of $Cu_2O$]+[integral intensity of CuO]+[integral intensity of $Cu(OH)_2$])×100).

In FIG. 11, the results are rated on a graded of A, B, C and D, depending on the ratio of CuO and $Cu(OH)_2$. The integral intensity is evaluated as A when the ratio of CuO or the ratio of $Cu(OH)_2$ of the film containing the cuprous oxide and/or the complex oxide of cuprous oxides is 10% or more and 100% or less. The integral intensity is evaluated as B when the ratio of CuO or the ratio of $Cu(OH)_2$ of the film containing the cuprous oxide and/or the complex oxide of cuprous oxides is 1% or more and less than 10%. The integral intensity is evaluated as C when the ratio of CuO or the ratio of $Cu(OH)_2$ of the film containing the cuprous oxide and/or the complex oxide of cuprous oxides is 0.1% or more and less than 1%. The integral intensity is evaluated as D when the ratio of CuO or the ratio of $Cu(OH)_2$ of the film containing the cuprous oxide and/or the complex oxide of cuprous oxides is 0.0% or more and less than 0.1%. When the ratio of CuO or the ratio of $Cu(OH)_2$ is 10% or more and 100% or less which is evaluated as A, the oxidizing seems to be proceeded excessively since the intensity includes until a depth of 5 [nm] when XPS analysis is conducted under the conditions that the x-ray radiation angle to the sample is 45 [degree] and the angle between the sample and detector is 90 [degree]. Adopting this method of analysis, the ratio of CuO and $Cu(OH)_2$ are 0.1% or more and less than 1%, which is evaluated as B, would be considered appropriate. When the ratio is evaluated as B, it is considered that the very thin region on the surface side is oxidized and deep region other than the very thin region is not oxidized by the oxidizing.

Since the appropriate amount of the vapor water presents in the chamber, the oxidizing gas whose temperature and partial pressure of oxide is adjusted and $Cu_2O$ layer on the surface side is reacted efficiently, CuO and $Cu(OH)_2$ which are heterogenous phase are produced in the very thin region of one atomic layer or thickness up to 1 [nm]. Since CuO and $Cu(OH)_2$ which are heterogenous phase are produced in the very thin region of one atomic layer or thickness up to 1 [nm], the voltage of $Cu_2O$ solar cell is increased. Although, when the substrate temperature is high or the duration time is long, the heterogenous phases such as CuO is produced in the deep region. The produced heterogenous phase such as CuO in deep region becomes impurities of $Cu_2O$ layer, and the current density of the $Cu_2O$ solar cell is deteriorated.

Example B-1~B-15, Comparative Example B-1~B-3

ITO (In:Sn=80:20, film thickness 20 nm) on a side in contact with glass and ATO (Sn:Sb=98:2, film thickness: 150 nm) are deposited on an upper surface of a glass substrate as a p-electrode on a back surface side. A $Cu_2O$ light-absorbing layer is formed on a transparent p-electrode by heating at 500 [degrees Celsius] by a sputtering method in an oxygen and argon gas atmosphere. Next the surface of the $Cu_2O$ light-absorbing layer is oxidized in conditions shown in FIG. 12. Thereafter, by an ALD method, 10 nm of $Ga_2O_3$ as a n-type layer is deposited. Thereafter, a transparent conductive film of AZO as the n-electrode is deposited on the n-type layer. A solar cell is obtained by forming an $MgF_2$ film as an antireflection film. The obtained solar cell is evaluated for a short circuit current (Jsc), an open circuit voltage (Voc), and a conversion efficiency.

The amount of light is adjusted to 1 sun by using a solar simulator simulating a light source of AM 1.5G and using a reference Si cell under a light source. A temperature in a measurement room is 25 [degrees Celsius] under an atmospheric pressure. A voltage is swept and a current density (current divided by a cell area) is measured. When a horizontal axis represents the voltage and a vertical axis represents the current density, a point intersecting the horizontal axis represents an open circuit voltage Voc and a point intersecting the vertical axis represents a short circuit current density Jsc. When the voltage and the current density are multiplied on a measurement curve and maximum points are Vmpp and Jmpp (maximum power point), respectively, FF=(Vmpp*Jmpp)/(Voc*Jsc), and a conversion efficiency Eff. is obtained by Eff.=Voc*Jsc*FF.

In the tables of FIG. 13 related to examples, the open circuit voltage (Voc), the shirt circuit current density (Jsc), and the conversion efficiency (Eff) of examples and comparative examples is shown.

Voc is evaluated as B when Voc is equal to less than Voc of a comparison example. Voc is evaluated as A when Voc is more than Voc of a comparison example. Jsc is evaluated as B when Jsc is equal to less than Jsc of a comparison example. Jsc is evaluated as A when Jsc is more than Eff of a comparison example. Eff is evaluated as B when Eff is equal to less than Eff of a comparison example. Eff is evaluated as A when Eff is more than Eff of a comparison example.

As shown in the table of FIG. 12 and FIG. 13, Jsc is equal or greater, Voc is improved, and the conversion efficiency is improved by the oxidizing is processed under the appropriate conditions.

Example C-1

ITO (In:Sn=80:20, film thickness 20 nm) on a side in contact with glass and ATO (Sn:Sb=98:2, film thickness: 150 nm) are deposited on an upper surface of a glass substrate as a p-electrode on a back surface side. 5.0 [µm (micrometre)] of a $Cu_2O$ light-absorbing layer is formed on a transparent p-electrode by heating at 500 [degrees Celsius] by a sputtering method in an oxygen and argon gas atmosphere. Next the surface of the $Cu_2O$ light-absorbing layer is oxidized in conditions shown in FIG. 14. The oxidized member is rapidly sealed at 25 [degrees Celsius] after the oxidizing and is analyzed.

Comparative Example C-1

A member that 200 [µm (micrometre)] of a single crystal $Cu_2O$ layer is formed on $Al_2O_3$ is oxidized in conditions shown in FIG. 14. The oxidized member is rapidly sealed at 25 [degrees Celsius] after the oxidizing and is analyzed.

Comparative Example C-2

A member that 200 [µm (micrometre)] of a single crystal $Cu_2O$ layer is formed on $Al_2O_3$ is treated with vapor water. The member which is treated with vapor water is oxidized in conditions shown in FIG. 14. The oxidized member is rapidly sealed at 25 [degrees Celsius] after the oxidizing and is analyzed.

A CuO phase ratio to the total phases of a region from the surface of the film containing the cuprous oxide and/or the complex oxide of cuprous oxides in which the oxidizing is processed to a depth of 10 [nm] is shown in the table of FIG. 15 related to example.

The CuO ratio is evaluated as A when the CuO phase ratio to the total phases of a region from the surface of the film containing the cuprous oxide and/or the complex oxide of cuprous oxides in which the oxidizing is processed to a depth of 10 [nm] is more than 10% and 100% or less. The CuO ratio is evaluated as B when the CuO phase ratio to the total phases of a region from the surface of the film containing the cuprous oxide and/or the complex oxide of cuprous oxides in which the oxidizing is processed to a depth of 10 [nm] is 1% or more and 10% or less. The CuO ratio is evaluated as C when the CuO phase ratio to the total phases of a region from the surface of the film containing the cuprous oxide and/or the complex oxide of cuprous oxides in which the oxidizing is processed to a depth of 10 [nm] is 0.1% or more and less than 1%.

As shown in the tables of FIG. 14 and FIG. 15, the CuO ratio of the oxidized film containing the cuprous oxide and/or the complex oxide of cuprous oxides around the surface is changed depending on the crystallinity and the ratio of OH group before the oxidizing. In addition, if the $Cu_2O$ layer whose deep region is oxidized such as Comparative Examples is used for a solar cell, the solar cell has low transmissivity of light at a wavelength of from 700 nm to 1000 nm due to the CuO. When the oxidizing is processed to the deep region, the transmissivity and the conversion efficiency are deteriorated.

Example D-1~D-3, Comparative Example D-1~D-8

ITO (In:Sn=80:20, film thickness 20 nm) on a side in contact with glass and ATO (Sn:Sb=98:2, film thickness: 150 nm) are deposited on an upper surface of a glass substrate as a p-electrode on a back surface side. 5.0 [μm] of a $Cu_2O$ light-absorbing layer is formed on a transparent p-electrode by heating at 500 [degrees Celsius] by a sputtering method in an oxygen and argon gas atmosphere. Next the surface of the $Cu_2O$ light-absorbing layer is oxidized in conditions shown in FIG. 12. Thereafter, by an ALD method, 10 nm of $Ga_2O_3$ as a n-type layer is deposited. Thereafter, a transparent conductive film of AZO as the n-electrode is deposited on the n-type layer. A solar cell is obtained by forming an $MgF_2$ film as an antireflection film. The obtained solar cell is evaluated for a short circuit current (Jsc) and an open circuit voltage (Voc).

The amount of light is adjusted to 1 sun by using a solar simulator simulating a light source of AM 1.5G and using a reference Si cell under a light source. A temperature in a measurement room is 25 [degrees Celsius] under an atmospheric pressure. A voltage is swept and a current density (current divided by a cell area) is measured. When a horizontal axis represents the voltage and a vertical axis represents the current density, a point intersecting the horizontal axis represents an open circuit voltage Voc and a point intersecting the vertical axis represents a short circuit current density Jsc.

In the tables of FIG. 17 related to examples, the open circuit voltage (Voc) of examples and comparative examples is shown together with the short-circuit current (Jsc).

Voc is evaluated as B when Voc is equal to less than Voc of a comparison example. Voc is evaluated as A when Voc is more than Voc of a comparison example. Jsc is evaluated as B when Jsc is equal to less than Jsc of a comparison example. Jsc is evaluated as A when Jsc is more than Jsc of a comparison example.

As shown in the table of FIG. 16 and FIG. 17, Jsc is equal or greater, Voc is improved, and the conversion efficiency is improved by the oxidizing is processed under the appropriate conditions.

In the specification, some elements are represented only by chemical symbols for elements.

Hereinafter, clauses of embodiments are additionally noted.

Clause 1

A method for manufacturing a solar cell comprising;

forming a p-electrode on the substrate:

forming a film containing cuprous oxide and/or a complex oxide of cuprous oxides as a main component on the p-electrode: and oxidizing the film containing the cuprous oxide and/or the complex oxide of cuprous oxides as a main component, wherein a partial pressure of oxide of the oxidizing is 5000 [Pa] or more and 200000 [Pa] or less, a concentration of vapor water of the oxidizing is $9.4\times10^{-1}$ [g/m$^3$] or more and $2.5\times10^3$ [g/m$^3$] or less, a temperature of the oxidizing is 40 [degrees Celsius] or more and 150 [degrees Celsius] or less, and a duration time of the oxidizing is 10 [sec] or more and 150 [min] or less.

Clause 2

The method for manufacturing the solar cell according to clause 1, wherein, when the partial pressure of oxide of the oxidizing is 5000 [Pa] or more and 50000 [Pa] or less, the temperature of the oxidizing is 50 [degrees Celsius] or more and 150 [degrees Celsius] or less and the duration time of the oxidizing is 5 [min] or more and 150 [min] or less.

Clause 3

The method for manufacturing the solar cell according to clause 1, wherein, when the partial pressure of oxide of the oxidizing is 10000 [Pa] or more and 200000 [Pa] or less, the temperature of the oxidizing is 40 [degrees Celsius] or more and 120 [degrees Celsius] or less and the duration time of the oxidizing is 10 [sec] or more and 120 [min] or less.

Clause 4

The method for manufacturing the solar cell according to clause 1, wherein, when the temperature of the oxidizing is 75 [degrees Celsius] or more and 125 [degrees Celsius] or less, the partial pressure of oxide of the oxidizing is 5000 [Pa] or more and 200000 [Pa] or less and the duration time of the oxidizing is 5 [min] or more and 45 [min] or less.

Clause 5

The method for manufacturing the solar cell according to clause 1, wherein, when the temperature of the oxidizing is 80 [degrees Celsius] or more and 120 [degrees Celsius] or less, the partial pressure of oxide of the oxidizing is 5000 [Pa] or more and 100000 [Pa] or less and the duration time of the oxidizing is 10 [min] or more and 45 [min] or less.

Clause 6

The method for manufacturing the solar cell according to any one of clauses 1 to 5, wherein, concentration of vapor water of the oxidizing is $9.4\times10^{-1}$ [g/m$^3$] or more and $2.5\times10^1$ [g/m$^3$] or less.

Clause 7

The method for manufacturing the solar cell according to clause 1 or 6, wherein, when the duration time of the oxidizing is 10 [sec] or more and less than 5 [min] and the temperature of the oxidizing is 40 [degrees Celsius] or more and less than 110 [degrees Celsius], the partial pressure of oxide of the oxidizing is 30000 [Pa] or more and 200000 [Pa] or less.

Clause 8

The method for manufacturing the solar cell according to clause 1 or 6, wherein, when the duration time of the oxidizing is 10 [sec] or more and less than 5 [min] and the temperature of the oxidizing is 110 [degrees Celsius] or more and 150 [degrees Celsius] or less, the partial pressure of oxide of the oxidizing is 10000 [Pa] or more and less than 100000 [Pa] or less.

Clause 9

The method for manufacturing the solar cell according to clause 1 or 6, wherein, when the duration time of the oxidizing is 5 [min] or more and less than 10 [min] and the temperature of the oxidizing is 40 [degrees Celsius] or more and 80 [degrees Celsius] or less, the partial pressure of oxide of the oxidizing is 10000 [Pa] or more and less than 100000 [Pa] or less.

Clause 10

The method for manufacturing the solar cell according to clause 1 or 6, wherein, when the duration time of the oxidizing is 10 [min] or more and less than 60 [min] and the temperature of the oxidizing is 40 [degrees Celsius] or more and 80 [degrees Celsius] or less, the partial pressure of oxide of the oxidizing is 10000 [Pa] or more and less than 50000 [Pa] or less.

Clause 11

The method for manufacturing the solar cell according to clause 1 or 6, wherein, when the duration time of the oxidizing is 60 [min] or more and less than 90 [min] and the temperature of the oxidizing is 40 [degrees Celsius] or more and 120 [degrees Celsius] or less, the partial pressure of oxide of the oxidizing is 10000 [Pa] or more and less than 40000 [Pa] or less.

Clause 12

The method for manufacturing the solar cell according to clause 1 or 6, wherein, when the duration time of the oxidizing is 90 [min] or more and 150 [min] or less and the temperature of the oxidizing is 40 [degrees Celsius] or more and 60 [degrees Celsius] or less, the partial pressure of oxide of the oxidizing is 5000 [Pa] or more and less than 25000 [Pa] or less.

Clause 13

The method for manufacturing the solar cell according to any one of clauses 1 to 12, further comprising;

forming an n-type layer on the oxidized film containing the cuprous oxide and/or the complex oxide of cuprous oxides.

Clause 14

The method for manufacturing the solar cell according to any one of clauses 1 to 13, further comprising;

forming an n-type layer on the oxidized film containing the cuprous oxide and/or the complex oxide of cuprous oxides; and forming an n-electrode on the n-type layer.

Clause 15

The method for manufacturing the solar cell according to any one of clauses 1 to 14, the film containing the cuprous oxide and/or the complex oxide of cuprous oxides as a main component is formed by sputtering, the member in which the p-electrode is formed is heated at 300 [degrees Celsius] or more and 600 [degrees Celsius] or less in the sputtering, a deposition rate of the sputtering is 0.02 [μm/min] or more and 20 [μm/min] or less in the sputtering, an oxygen partial pressure of the sputtering atmosphere is 0.01 [Pa] or more and 4.8 [Pa] or less, when the deposition rate is denoted by d, the oxygen partial pressure of the sputtering satisfies 0.55×d [Pa] or more and 1.00×d [Pa] or less.

Clause 16

The method for manufacturing the solar cell according to clause 15, wherein the member in which the p-electrode is formed is heated at 350 [degrees Celsius] or more and 500 [degrees Celsius] or less in the sputtering.

Clause 17

A multi-junction solar cell comprising:

the solar cell manufactured by the method according to any one of clauses 1 to 16.

Clause 18

A solar cell module comprising:

the solar cell manufactured by the method according to any one of clauses 1 to 16 or the multi-junction solar cell according to clause 17.

Clause 19

A photovoltaic power generation system comprising:

the solar cell module according to clause 18 wherein the solar cell module generates electric power.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a solar cell comprising:

forming a p-electrode on the substrate;

forming a film containing cuprous oxide and/or a complex oxide of cuprous oxides as a main component on the p-electrode; and oxidizing the film containing the cuprous oxide and/or the complex oxide of cuprous oxides as a main component, wherein a partial pressure of oxide of the oxidizing is 5000 [Pa] or more and 200000 [Pa] or less, a concentration of vapor water of the oxidizing is $9.4\times10^{-1}$ [g/m$^3$] or more and $2.5\times10^3$ [g/m$^3$] or less, a temperature of the oxidizing is 40 [degrees Celsius] or more and 150 [degrees Celsius] or less, and a duration time of the oxidizing is 10 [sec] or more and 150 [min] or less.

2. The method for manufacturing the solar cell according to claim 1, wherein, when the partial pressure of oxide of the oxidizing is 5000 [Pa] or more and 50000 [Pa] or less, the temperature of the oxidizing is 50 [degrees Celsius] or more and 150 [degrees Celsius] or less and the duration time of the oxidizing is 5 [min] or more and 150 [min] or less.

3. The method for manufacturing the solar cell according to claim 1, wherein, when the partial pressure of oxide of the oxidizing is 10000 [Pa] or more and 200000 [Pa] or less, the temperature of the oxidizing is 40 [degrees Celsius] or more and 120 [degrees Celsius] or less and the duration time of the oxidizing is 10 [sec] or more and 120 [min] or less.

4. The method for manufacturing the solar cell according to claim 1, wherein, when the temperature of the oxidizing is 75 [degrees Celsius] or more and 125 [degrees Celsius] or less, the partial pressure of oxide of the oxidizing is 5000 [Pa] or more and 200000 [Pa] or less and the duration time of the oxidizing is 5 [min] or more and 45 [min] or less.

5. The method for manufacturing the solar cell according to claim 1, wherein, when the temperature of the oxidizing is 80 [degrees Celsius] or more and 120 [degrees Celsius] or less, the partial pressure of oxide of the oxidizing is 5000 [Pa] or more and 100000 [Pa] or less and the duration time of the oxidizing is 10 [min] or more and 45 [min] or less.

6. The method for manufacturing the solar cell according to claim 1, wherein, concentration of vapor water of the oxidizing is $9.4\times10^{-1}$ [g/m$^3$] or more and $2.5\times10^{1}$ [g/m$^3$] or less.

7. The method for manufacturing the solar cell according to claim 1, wherein, when the duration time of the oxidizing is 10 [sec] or more and less than 5 [min] and the temperature of the oxidizing is 40 [degrees Celsius] or more and less than 110 [degrees Celsius], the partial pressure of oxide of the oxidizing is 30000 [Pa] or more and 200000 [Pa] or less.

8. The method for manufacturing the solar cell according to claim 1, wherein, when the duration time of the oxidizing is 10 [sec] or more and less than 5 [min] and the temperature of the oxidizing is 110 [degrees Celsius] or more and 150 [degrees Celsius] or less, the partial pressure of oxide of the oxidizing is 10000 [Pa] or more and less than 100000 [Pa] or less.

9. The method for manufacturing the solar cell according to claim 1, wherein, when the duration time of the oxidizing is 5 [min] or more and less than 10 [min] and the temperature of the oxidizing is 40 [degrees Celsius] or more and less than 80 [degrees Celsius], the partial pressure of oxide of the oxidizing is 10000 [Pa] or more and less than 100000 [Pa].

10. The method for manufacturing the solar cell according to claim 1, wherein, when the duration time of the oxidizing is 10 [min] or more and less than 60 [min] and the temperature of the oxidizing is 40 [degrees Celsius] or more and less than 80 [degrees Celsius], the partial pressure of oxide of the oxidizing is 10000 [Pa] or more and 50000 [Pa] or less.

11. The method for manufacturing the solar cell according to claim 1, wherein, when the duration time of the oxidizing is 60 [min] or more and less than 90 [min] and the temperature of the oxidizing is 40 [degrees Celsius] or more and 120 [degrees Celsius] or less, the partial pressure of oxide of the oxidizing is 10000 [Pa] or more and 40000 [Pa] or less.

12. The method for manufacturing the solar cell according to claim 1, wherein, when the duration time of the oxidizing is 90 [min] or more and 150 [min] or less and the temperature of the oxidizing is 40 [degrees Celsius] or more and 60 [degrees Celsius] or less, the partial pressure of oxide of the oxidizing is 5000 [Pa] or more and 25000 [Pa] or less.

13. The method for manufacturing the solar cell according to claim 1, further comprising;

forming an n-type layer on the oxidized film containing the cuprous oxide and/or the complex oxide of cuprous oxides.

14. The method for manufacturing the solar cell according to claim 1, further comprising;

forming an n-type layer on the oxidized film containing the cuprous oxide and/or the complex oxide of cuprous oxides; and forming an n-electrode on the n-type layer.

15. The method for manufacturing the solar cell according to claim 1, the film containing the cuprous oxide and/or the complex oxide of cuprous oxides as a main component is formed by sputtering, the member in which the p-electrode is formed is heated at 300 [degrees Celsius] or more and 600 [degrees Celsius] or less in the sputtering, a deposition rate of the sputtering is 0.02 [μm/min] or more and 20 [μm/min] or less in the sputtering, an oxygen partial pressure of the sputtering atmosphere is 0.01 [Pa] or more and 4.8 [Pa] or less, when the deposition rate is denoted by d, the oxygen partial pressure preferably satisfies $0.55\times d$ [Pa] or more and $1.00\times d$ [Pa] or less.

16. The method for manufacturing the solar cell according to claim 15, wherein the member in which the p-electrode is formed is heated at 350 [degrees Celsius] or more and 500 [degrees Celsius] or less in the sputtering.

17. A multi-junction solar cell comprising:

the solar cell manufactured by the method according to claim 1.

18. A solar cell module comprising:

the solar cell manufactured by the method according to claim 1.

19. A photovoltaic power generation system comprising:

the solar cell module according to claim 18, wherein the solar cell module generates electric power.

* * * * *